(12) United States Patent
Kim et al.

(10) Patent No.: US 12,424,764 B2
(45) Date of Patent: Sep. 23, 2025

(54) RF MODULE FOR ANTENNA AND ANTENNA APPARATUS COMPRISING SAME

(71) Applicant: KMW INC., Hwaseong-si (KR)

(72) Inventors: Duk Yong Kim, Yongin-si (KR); Young Chan Moon, Suwon-si (KR); Joon Hyong Shim, Yongin-si (KR); Sung Hwan So, Hwaseong-si (KR); Bae Mook Jeong, Suwon-si (KR); Min Seon Yun, Anyang-si (KR); Kyo Sung Ji, Hwaseong-si (KR); Chi Back Ryu, Hwaseong-si (KR); Sung Ho Jang, Hwaseong-si (KR); Jae Hong Kim, Yongin-si (KR); Oh Seog Choi, Yongin-si (KR); Yong Won Seo, Daejeon (KR)

(73) Assignee: KMW INC., Hwaseong-si (KR)

( * ) Notice: Subject to any disclaimer, the term of this patent is extended or adjusted under 35 U.S.C. 154(b) by 183 days.

(21) Appl. No.: 18/207,575

(22) Filed: Jun. 8, 2023

(65) Prior Publication Data

US 2023/0327345 A1 Oct. 12, 2023

Related U.S. Application Data

(63) Continuation of application No. PCT/KR2021/018509, filed on Dec. 8, 2021.

(30) Foreign Application Priority Data

Dec. 8, 2020 (KR) .................. 10-2020-0170576
Dec. 8, 2021 (KR) .................. 10-2021-0174364

(51) Int. Cl.
*H01Q 21/06* (2006.01)
*H01Q 1/02* (2006.01)
(Continued)

(52) U.S. Cl.
CPC ........... *H01Q 21/0025* (2013.01); *H01Q 1/02* (2013.01); *H01Q 1/42* (2013.01); *H01Q 15/141* (2013.01);
(Continued)

(58) Field of Classification Search
CPC .. H01Q 21/0025; H01Q 21/24; H01Q 21/065; H01Q 21/08; H01Q 1/02;
(Continued)

(56) References Cited

U.S. PATENT DOCUMENTS

| 12,034,214 B2 * | 7/2024 | Yoo ..................... H01Q 1/526 |
| 2016/0126629 A1 * | 5/2016 | Cherrette ............... H01Q 3/04 |
| | | 342/372 |
| 2020/0052363 A1 | 2/2020 | Yoo et al. |

FOREIGN PATENT DOCUMENTS

| CN | 210723354 U | 6/2020 |
| JP | 2009-159430 A | 7/2009 |

(Continued)

OTHER PUBLICATIONS

Non-final Office Action mailed on May 21, 2024 from the Japanese Patent Office for Japanese Application No. 2023-534671.
(Continued)

*Primary Examiner* — Awat M Salih
(74) *Attorney, Agent, or Firm* — Insight Law Group, PLLC; Seung Lee

(57) ABSTRACT

Proposed are an antenna RF module and an antenna apparatus including the antenna RF modules. The antenna RF module includes an RF filter arranged on a front surface of a main board, a radiation element module arranged on a front surface of the RF filter, at least one reflector grill pin arranged between the RF filter and the radiation element module and grounding (GND) the radiation element module, outside air being introduced from in front of the RF filter to
(Continued)

in back of the RF filter or being discharged from in back of the RF filter to in front of the RF filter through the at least one reflector grill pin, and a radome cover combined with the front surface of the RF filter and protecting the radiation element module from the outside. The antenna RF module provides the advantage of greatly improving overall performance in heat dissipation.

20 Claims, 35 Drawing Sheets

(51) Int. Cl.
| | |
|---|---|
| *H01Q 1/42* | (2006.01) |
| *H01Q 15/14* | (2006.01) |
| *H01Q 21/00* | (2006.01) |
| *H01Q 23/00* | (2006.01) |
| *H03F 1/30* | (2006.01) |
| *H03F 3/19* | (2006.01) |
| *H01Q 1/24* | (2006.01) |

(52) U.S. Cl.
CPC ............. *H01Q 23/00* (2013.01); *H03F 1/30* (2013.01); *H03F 3/19* (2013.01); *H01Q 1/246* (2013.01); *H03F 2200/447* (2013.01); *H03F 2200/451* (2013.01)

(58) Field of Classification Search
CPC ........ H01Q 1/42; H01Q 1/246; H01Q 15/141; H01Q 23/00; H03F 1/30; H03F 3/19; H03F 3/195; H03F 3/245; H03F 2200/447; H03F 2200/451; H01P 1/2053; H01P 1/20
See application file for complete search history.

(56) References Cited

FOREIGN PATENT DOCUMENTS

| | | |
|---|---|---|
| JP | 2017-533673 A | 11/2017 |
| JP | 2019-134591 A | 8/2019 |
| KR | 10-2015-0127154 A | 11/2015 |
| KR | 10-2019-0140857 A | 12/2019 |
| KR | 10-2020-0132659 A | 11/2020 |
| WO | 2019/151762 A1 | 8/2019 |
| WO | 2020/231148 A1 | 11/2020 |

OTHER PUBLICATIONS

International Search Report mailed Mar. 21, 2022 for International Application No. PCT/KR2021/018509 and its English translation.
European Search Report mailed Jan. 27, 2025 from European Patent Office for Application No. 21903829.6.

* cited by examiner

FIG. 13
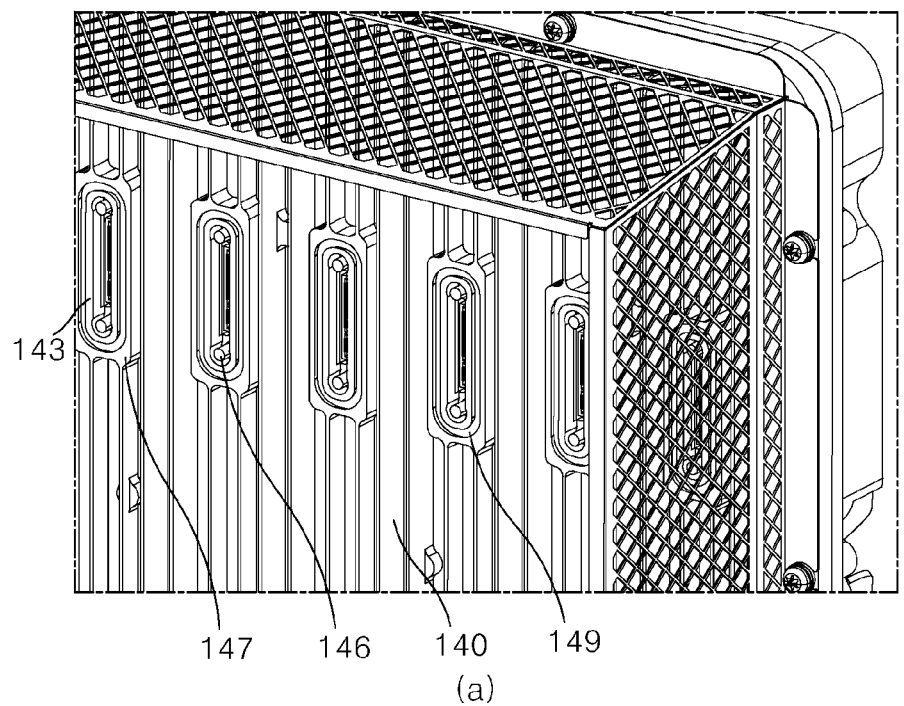
(a)
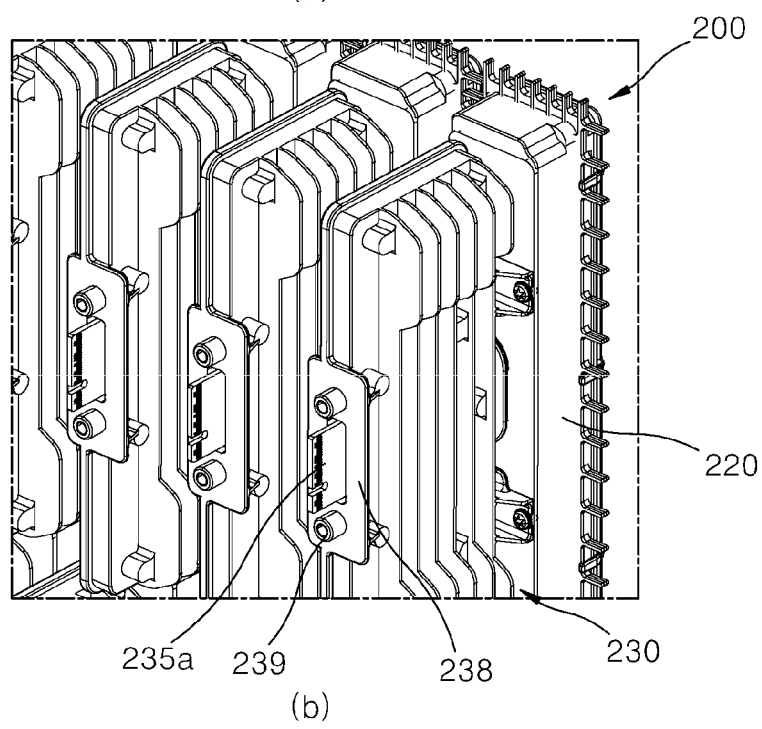
(b)

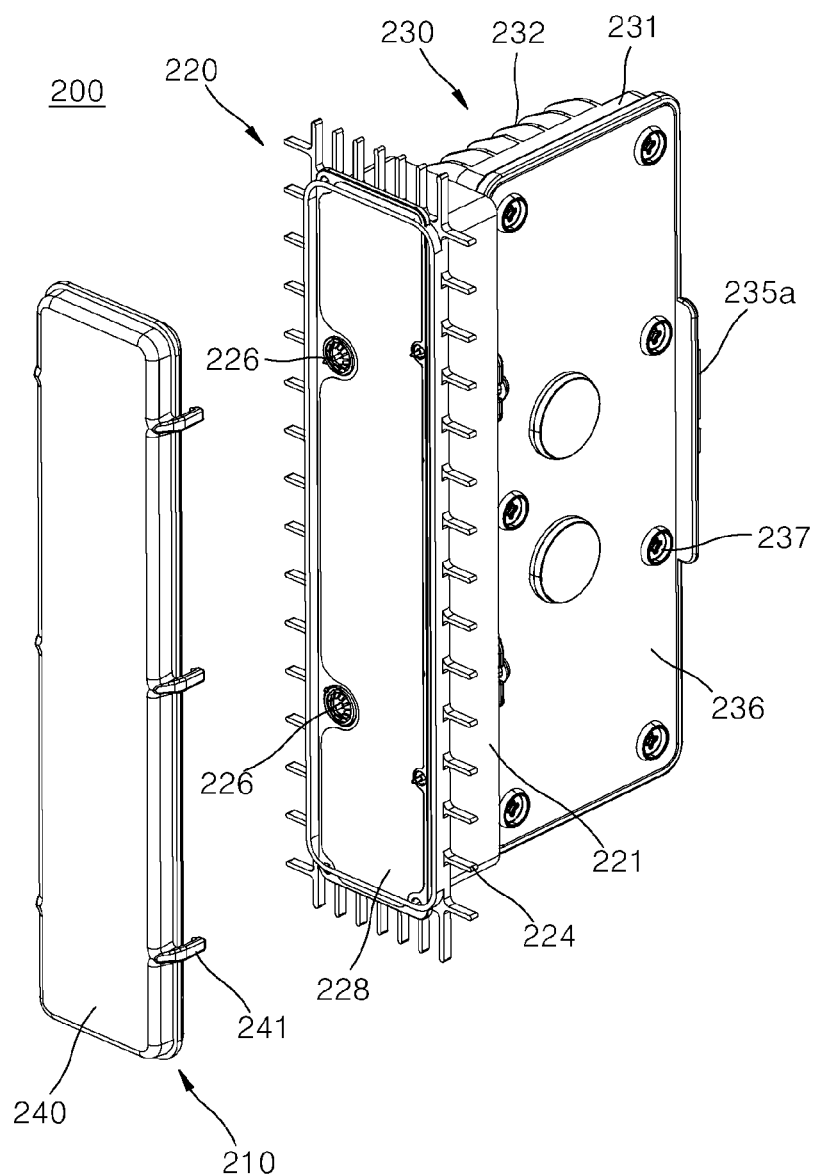

RF MODULE FOR ANTENNA AND ANTENNA APPARATUS COMPRISING SAME

CROSS-REFERENCE TO RELATED APPLICATIONS

This application is a continuation application of International Application No. PCT/KR2021/018509, filed Dec. 8, 2021, which claims the benefit of Korean Patent Application Nos. 10-2020-0170576, filed Dec. 8, 2020; and 10-2021-0174364, filed Dec. 8, 2021, in the Korean Intellectual Property Office, the disclosures of which are incorporated herein in their entirety by reference.

TECHNICAL FIELD

The present disclosure relates to an antenna RF module and an antenna apparatus including the antenna RF modules and, more particularly, to an antenna RF module in which a radiation element module and an RF element are completely separated from a main board and are arranged to be exposed to outside air in front, and an antenna apparatus including the antenna RF modules. The antenna RF module is capable of solving the difficulty in achieving a design for dissipating heat toward the front of a radiation element in the related art.

BACKGROUND ART

An antenna of a base station, such as a relay station, that is used in a mobile communication system has various shapes and structures. Normally, the antenna has a structure in which a multiplicity of radiation elements are suitably arranged on at least one reflection plate that stands upright in a lengthwise direction thereof.

In recent years, research has been actively conducted in order to satisfy requirements for high performance of an antenna based on Multiple Input Multiple Output (MIMO), and at the same time to achieve a miniaturized, lightweight and low-cost structure. Particularly, in a case where a patch-type radiation element that realizes linear polarization or circular polarization is used in an antenna apparatus, normally, a technique is widely used in which the radiation element made of a dielectric substrate of a plastic or ceramic material is plated and is combined with a printed circuit board (PCB) by soldering.

FIG. 1 is an exploded perspective view illustrating an example of an antenna apparatus 1 in the related art.

In the antenna apparatus 1, as illustrated in FIG. 1, a multiplicity of radiation elements 35 are arranged to be exposed toward a direction of a front surface of an antenna housing main body 10 that corresponds to a beam output direction, in such a manner that a beam is output in a desired direction and that beamforming is facilitated, and a radome 50 is mounted on a front end portion of the antenna housing main body 10 with the multiplicity of radiation elements 35 in between, in order to provide protection from an outside environment.

More specifically, the antenna apparatus 1 in the related art includes the antenna housing main body 10 having the form of a rectangular parallelepiped-shaped casing with a small thickness that is open at the front surface thereof and that has a multiplicity of heat dissipation pins 11 integrally formed on the rear surface thereof, a main board 20 arranged in a stacked manner on a rear surface of the antenna housing main body 10 inside the antenna housing main body 10, and an antenna board 30 arranged in a stacked manner on a front surface of the antenna housing main body 10 inside the antenna housing main body 10.

A patch-type radiation element or dipole-type radiation elements 35 may be mounted in a front surface of the antenna board 30, and a radome 50 that protects components inside the antenna housing main body 10 from the outside and facilitates radiation from the radiation elements 35 may be installed on a front surface of the antenna housing main body 10.

However, in an example of the antenna apparatus 1 in the related art, a front portion of the antenna housing main body 10 is all closed by the radome 50 as a single unit. For this reason, the radome 50 itself serves as an obstacle that interrupts dissipation of heat of the antenna apparatus 1 toward a front direction. At this point, in a case where the radome 5 is removed and where the radiation elements 35 are exposed to the outside, the antenna board 30 is also necessarily exposed to the outside. Thus, the antenna board 30 may be less protected from a surrounding environment.

Furthermore, the antenna board 30 is made of a FR-4 epoxy material, having low thermal conductivity, that is used as a material for a PCB. As is the case with the radome 50, a front portion of an installation space (not illustrated) in which a main board is installed and in which heat is substantially generated is all closed. Thus, a problem occurs in that a design for heat dissipation toward a front direction is difficult to achieve.

For this reason, analog amplification elements, as well as digital elements, have to be all concentratedly mounted on a rear surface in a heat dissipation direction of the main board, rather than a front surface thereof. Thus, a space for heat dissipation is limited. There occurs a problem in that overall heat dissipation performance of the antenna apparatus 1 is decreased.

SUMMARY OF INVENTION

Technical Problem

An object of the present disclosure, which is contrived to solve the above-mentioned problems, is to provide an antenna RF module capable of being arranged in a front direction in such a manner as to be exposed to outside air and thus dissipating heat distributively to in front of and in back of a mobile communication system, and an antenna apparatus including the antenna RF modules. The antenna RF module is capable of significantly improving performance in heat dissipation.

Another object of the present disclosure is to provide an antenna RF module including a multiplicity of reflector grill pins that perform a function of grounding radiation elements and, at the same time, perform a function of a reflector that blocks signal interference with electrical elements in a rear direction, and an antenna apparatus including the antenna RF modules.

Still another object of the present disclosure is to provide an antenna RF module that is manufactured by modularly integrating an RF filter, as a single unit, a radiation element module, as a single unit, and a radome cover, as a single unit, and is easily modularly assembled to a front housing that separates an installation space in which a main board is installed and an outside-air space in front, and an antenna apparatus including the antenna RF modules.

Still another object of the present disclosure is to provide an antenna RF module in which amplification-unit elements and a surge board that are mounted on a main board in the related art are provided in such a manner as to be completely separated from an installation space in which a main board is installed, or to be spaced apart from the main board, and an antenna apparatus including the antenna RF modules. In the antenna RF module, a design for simplifying components on front and rear surfaces of the main board can be achieved.

The present disclosure is not limited to the above-mentioned objects. From the following description, other objects not mentioned would be clearly understandable by a person of ordinary skill in the art to which the present disclosure pertains.

Solution to Problem

According to an aspect of the present disclosure, which is contrived to solve the above-mentioned problems, there is provided an antenna RF module including: an RF filter arranged on a front surface of a main board; a radiation element module arranged on a front surface of the RF filter; and an amplification element module including: an amplification unit body arranged between the main board and the RF filer and having a board seating space that is open at one side or the other side in a width direction; an amplification unit board seated inside the amplification unit body, a front end portion of an edge of the amplification unit board being connected to the RF filter for signal transmission, a rear end portion of the edge thereof being connected to the main board for signal transmission, and at least one analog amplification element being mounted on one surface or the other surface thereof; and an amplification unit cover provided in such a manner as to cover the amplification unit board, wherein heat generated from the at least one analog amplification element on the amplification unit board is distributively dissipated to outside air in front of one side or the other side, in a width direction, of the amplification element module through a multiplicity of amplification-unit heat sink pins integrally formed on an outer surface of the amplification unit body and through a multiplicity of amplification-unit-cover heat sink pins integrally formed on an outer surface of the amplification unit cover.

In the antenna RF module, one of PAs, as the analog amplification elements, that realize a 2T2R antenna may be arranged to be mounted on one surface of both surfaces of the amplification unit board, and the other one of the PAs, as the analog amplification elements, that realize the 2T2R antenna may be arranged to be mounted on the other surface of the both surfaces of the amplification unit board.

In the antenna RF module, the RF filter may include: a filter body in which a multiplicity of cavities are formed in such a manner as to be open at front sides thereof; and a resonance bar arranged inside each of the multiplicity of cavities, and the reflector grill pins may be formed along an edge of a front end portion of the filter body in such a manner as to extend upward, downward, leftward, and rightward from the edge, respectively, and to be spaced a predetermined distance apart.

In the antenna RF module, the reflector grill pins may perform a function of a reflector, along with a filter outer panel arranged in such a manner as to close a front surface of the filter body.

In the antenna RF module, a distance between the reflector grill pins may be set considering a length of the radiation element included in the radiation element module.

In the antenna RF module, the RF filter and the reflector grill pins may be integrally manufactured of a molding material having a metal component, using a die-casting molding technique.

In the antenna RF module, one or several of the reflector grill pins may be formed to extend in such a manner as to overlap one or several reflector grill pins, respectively, that are formed on another RF filter that is adjacent thereto.

In the antenna RF module, the RF filter may include: a filter body in which a multiplicity of cavities are formed in such a manner as to be open at front sides thereof; a resonance bar arranged inside each of the multiplicity of cavities; and a filter outer panel arranged to close a front surface of the filter body, and the radiation element module may be combined with the filter body by being seated therein in such a manner as to cover a front surface of the filter outer panel.

In the antenna RF module, a multiplicity of hook combination portions may be formed on a portion of an edge of a radome cover, and the radome cover may be hook-combined with the filter body by the multiplicity of hook combination portions being combined with a stepped portion of the filter body.

In the antenna RF module, the radome cover may be combined with the filter body while blocking the radiation element module from being viewed from the outside.

In the antenna RF module, the amplification element module may receive a signal from the main board and a signal from the RF filter, may amplify these signals by a predetermined value, and may output the resulting signals.

In the antenna RF module, the amplification unit board may be combined with the RF filter in a feed through-pin coupling manner, with a through-pin terminal in between, and may be combined with the main board in a socket-pin coupling manner.

In the antenna RF module, at least one male socket for the combination with the main board in a socket-pin coupling manner may be provided on the amplification unit board.

In the antenna RF module, the RF filter and the radiation element module may be combined with each other in a feed through-pin coupling manner, with a through-pin in between.

According to another aspect of the present disclosure, there is provided an antenna apparatus including: a main board, at least one digital element being mounted on a front surface or rear surface of the main board; a casing-shaped rear housing formed to have an installation space in which the main board is installed, the installation space being open at the front side; a front housing arranged to close the open installation space in the rear housing and separate the installation space in the rear housing and an outside space; and a plurality of antenna RF modules arranged in front of the front housing and connected to the main board through an electrical signal line, wherein each of the plurality of antenna RF modules includes: an RF filter: arranged on a front surface of the main board; a radiation element module arranged on a front surface of the RF filter; and an amplification element module including: an amplification unit body arranged between the main board and the RF filer and having a board seating space that is open at one side or the other side in a width direction; an amplification unit board seated inside the amplification unit body, a front end portion of an edge of the amplification unit board being connected to the RF filter for signal transmission, a rear end portion of the edge thereof being connected to the main board for signal transmission, and at least one analog amplification element being mounted on one surface or the other surface thereof; and an amplification unit cover provided in such a manner as to cover the amplification unit board, and wherein heat generated from the at least one analog amplification element on the amplification unit board is distributively dissipated to outside air in front of one side or the other side, in a width direction, of the amplification element module through a multiplicity of amplification-unit heat sink pins integrally formed on an outer surface of the amplification unit body and through a multiplicity of amplification-unit-cover heat sink pins integrally formed on an outer surface of the amplification unit cover.

In the antenna apparatus, one of two PAs, as the analog amplification elements, that realize an 2T2R antenna may be arranged to be mounted on one of both surface of the amplification unit board, and the other one of the two PAS, as the analog amplification elements, that realize the 2T2R antenna may be arranged to be mounted on the other one of the both surfaces of the amplification unit board.

The antenna apparatus may further comprising: a surge sub-board adhesively arranged on a front surface of the rear housing in the installation space in the rear housing in such a manner as to be spaced apart from the back of the main board; and a PSU sub-board arranged on top of the main board in the installation space in the rear housing in such a manner as to have a front surface continuous with a front surface of the main board, wherein the surge sub-board and the PSU sub-board may be electrically connected to each other with at least one bus bar in between, and the PSU board and the main board may be electrically connected to each other with at least one bus bar in between.

In the antenna apparatus, a multiplicity of heat dissipation pins may be integrally formed on a front of the front housing.

In the antenna apparatus, at least one intermediary female socket that is combined in a socket-pin coupling manner with the RF filter may be formed on the front surface of the main board.

The antenna apparatus may further include an RFIC sub-board adhesively arranged on a rear surface of the front housing in such a manner as to be spaced apart from the front of the main board in the installation space in the rear housing, wherein RFIC elements that correspond to FPGA elements, respectively, mounted on the main board may be arranged to be mounted on the RFIC sub-board.

In the antenna apparatus, heat generated from the RFIC elements may be brought into surface contact with the front housing for heat transfer and may be dissipated in a heat transfer manner.

The antenna apparatus may further include at least one ventilation panel combined with a portion of the edge of the front housing in a manner that surrounds lateral sides of a multiple of outermost RF modules, wherein front end portions of the multiplicity of antenna RF modules may be positioned in such a manner as to be spaced further away, toward a front direction, from an edge of the front housing.

In the antenna apparatus, a multiplicity of ventilation holes having a predetermined size may be formed in the ventilation panel.

Advantageous Effects of Invention

An antenna RF module, an antenna RF module assembly including the antenna RF modules, and an antenna apparatus including the antenna RF module assembly according to first, second, and third embodiments, respectively, of the present disclosure can achieve various effects that follow.

Firstly, heat generated from heat generating elements of the antenna apparatus is spatially separated. Thus, it is possible that the heat is distributively dissipated toward a forward-backward direction of the antenna apparatus. Accordingly, the effect of greatly improving performance in heat dissipation can be achieved.

Secondly, instead of an existing radome, as a single unit, that interrupts dissipation of heat to in front of an antenna, a radome, as a single unit, that is combined on a per-RF module basis is designed, thereby removing an obstacle to heat dissipation. Accordingly, the effect of more effectively protecting a radiation element module can be achieved.

Thirdly, RF-related amplification elements that are concentratedly mounted to the side of a main board in the related art, along with an RF filter, are re-configured as an RF module, and the outside-air space is positioned in front of a front housing. Accordingly, the effect of greatly improving overall heat dissipation performance of the antenna apparatus can be achieved.

Fourthly, the RF-related amplification elements (particularly, an RFIC sub-board) are separated from the main board, and thus the number of layers of the main board that is a multi-layer board is greatly reduced. Accordingly, the effect of reducing the cost of manufacturing the main board can be achieved.

Fifthly, an RF-related component having frequency-dependence is configured as an RF module. The RF modules are detachably combined with each other for signal transmission, through a front housing that additionally has a heat dissipation function. In a case where an individual RF-related component that constitutes the antenna apparatus is defective and is damaged, only a corresponding RF module can be replaced. Accordingly, the effect of making maintenance of the antenna apparatus facilitated can be achieved.

Sixthly, it is possible that heat is distributively dissipated in the antenna apparatus. Therefore, the length and volume of a heat sink (a heat dissipation pin) integrally formed on a rear surface of a rear housing can be reduced. Accordingly, the effect of facilitating design for reducing product thickness can be achieved.

Seventhly, an RF filter and an amplification element module that constitute the RF module are completely separated from each other in a forward-backward direction. Accordingly, the effect of minimizing mutual thermal influence can be achieved.

The present disclosure is not limited to the above-mentioned effects. From the following description, other effects not mentioned would be understandable by a person of ordinary skill in the art to which the present disclosure pertains.

BRIEF DESCRIPTION OF DRAWINGS

FIG. 13 is an enlarged perspective view illustrating a portion of a front surface of the front housing that the RF module is attached to and detached from, and a portion of a rear surface of the RF module.

FIG. 18 is an exploded perspective view illustrating a state where a radome, one of constituent elements of the RF module, is installed.

Figure 1:
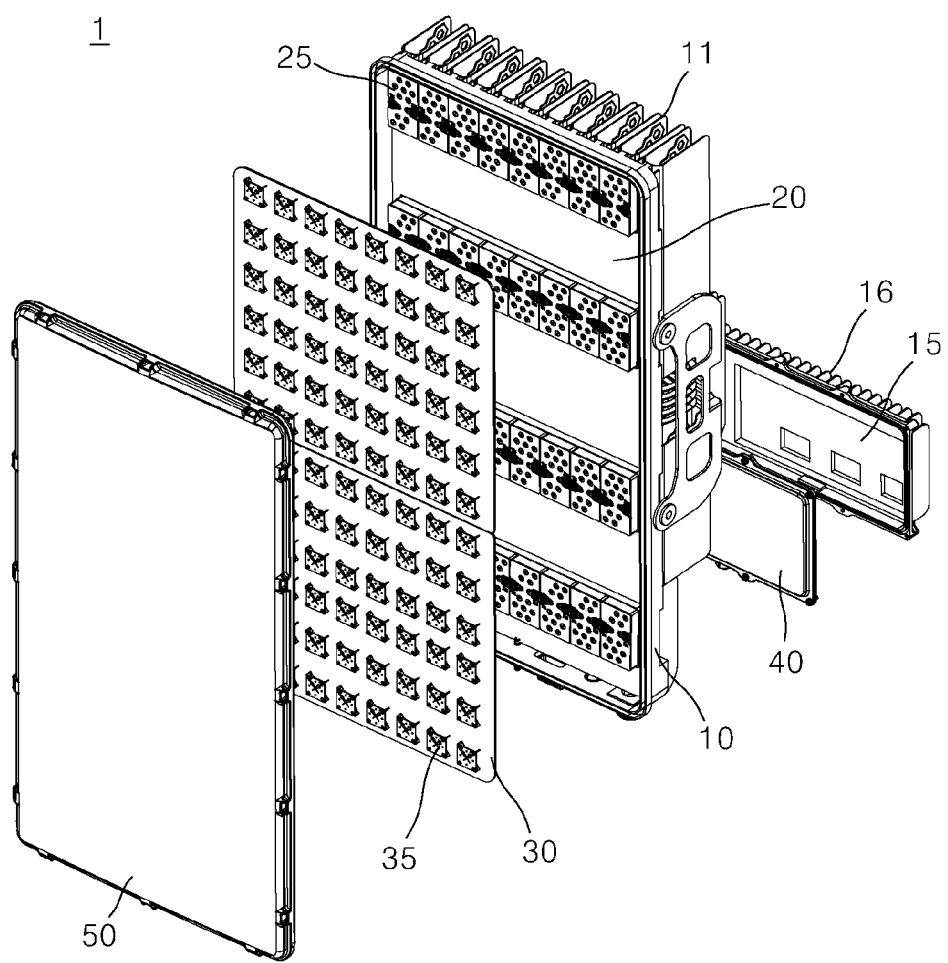
FIG. 1 is an exploded perspective view illustrating an example of an antenna apparatus in the related art.

<Description of the Reference Numerals in the Drawings>

| | |
|---|---|
| 100: Antenna Apparatus | 110: Rear Housing |
| 111: Rear Heat Dissipation Pin | 115: Installation Space |
| 120, 120a~120d: Ventilation Panel | 130: Handle |
| 140: Front Housing | 141: Front Heat Dissipation Pin |
| 143: Socket Through-hole | 144: Foreign-material Introduction Prevention Ring |
| 146: Module Assembling Screw | 147: Surface Seating Portion |
| 149: Ring Installation Groove | 150: RFIC Sub-board |
| 153: RFICs(RFIC Elements) | 155: Intermediary Female Socket |
| 157: Separation Support | 160: Thermal Separation Plate |
| 161: Intermediary Male Socket | 170: Main Board |
| 171: Frontmost Female Socket | 173: Digital Element |
| 180: PSU Sub-board | 183: PSU |
| 185: Bus Bar | 185': Bus Bar Fastening Screw |
| 190: Surge Sub-board | 195: Bus Bar |
| 195': Bus Bar Fastening Screw | 200: RF Module |
| 210: Radiation Element Module | 211: Radiation-element Printed Circuit Board |
| 212: Antenna Patch Circuit Unit | 213: Electricity Supply Line |
| 214a: Input Screw Hole | 214b: Output Screw Hole |
| 217: Radiation Director | 217a: Multiplicity of Combination Holes |
| 220: RF Filter | 221: Filter Body |
| 222: Cavity | 223: Resonance Bar |
| 224: Reflector Grill Pin | 226: Through-pin Terminal |
| 227: Filter Tuning Cover | 228: Filter Outer Panel |
| 229: Through-pin Terminal | 230: Amplification Element Module |
| 231: Amplification Unit Body | 232: Amplification-unit Heat Sink Pin |
| 233: Board Seating Space | 234: Assembling Panel |
| 235: Amplification Unit Board | 235a: Male Socket |
| 236: Amplification Unit Cover | 238: Joint Flange |
| 239: Screw Boss | 240: Radome Cover |
| 241: Hook Combination Portion | 247a: Multiplicity of Combination Protrusions |
| 250: Module Assembling Screw | 300: Antenna RF Module Assembly |
| 400: Outside Mounting Member | |

DESCRIPTION OF EMBODIMENTS

An antenna radio frequency (RF) module, and an antenna apparatus including the antenna RF modules according to embodiments, respectively, of the present disclosure, will be described in detail below with reference to the accompanying drawings.

It should be noted that, in assigning a reference numeral to a constituent element that is illustrated in the drawings, the same constituent element, although illustrated in different drawings, is designated by the same reference numeral, if possible, throughout the drawings. In addition, specific descriptions of a well-known configuration and function associated with the first, second, and third embodiments of the present disclosure will be omitted when determined as making the e embodiments of the present disclosure difficult to understand.

The ordinal numbers first, second, and so forth, the letters A, B, and so forth, the parenthesized letters (a), (b), and so forth may be used to describe constituent elements of the first, second, third embodiments of the present disclosure. These ordinal numbers, letters, parenthesized letters are only used to distinguish among constituent elements and do not impose any limitation to the natures of constituent elements to which these ordinal numbers, letters, or parenthesized letters, respectively, are assigned, the turn of each of the constituent elements to operate or function, the order of the constituent elements, and the like. Unless otherwise defined, all terms including technical or scientific terms, which are used in the present specification, have the same meanings as are normally understood by a person of ordinary skill in the art to which the present disclosure pertains. A term as defined in a dictionary in general use should be construed as having the same meaning as interpreted in context in the relevant technology, and, unless otherwise explicitly defined in the present specification, should not be construed as having an ideal meaning or an excessively-formal meaning.

According to the present disclosure, a radome, as a single unit, that is combined on a per-RF module basis is provided instead of a radome, as a single unit, of an antenna apparatus in the related art, and RF-related components that are mounted on a main board inside an antenna housing in the related art are configured as an RF module, together with an RF filter, or are configured in a manner that is separated from the main board. The technical idea of the present disclosure is that heat generated from various heat generating elements of the antenna apparatus is spatially separated and distributed. An antenna RF module 200, and an antenna apparatus 100 including the antenna RF modules according to the embodiments, respectively, of the present disclosure will be described below with reference to the drawings.

Figure 2:
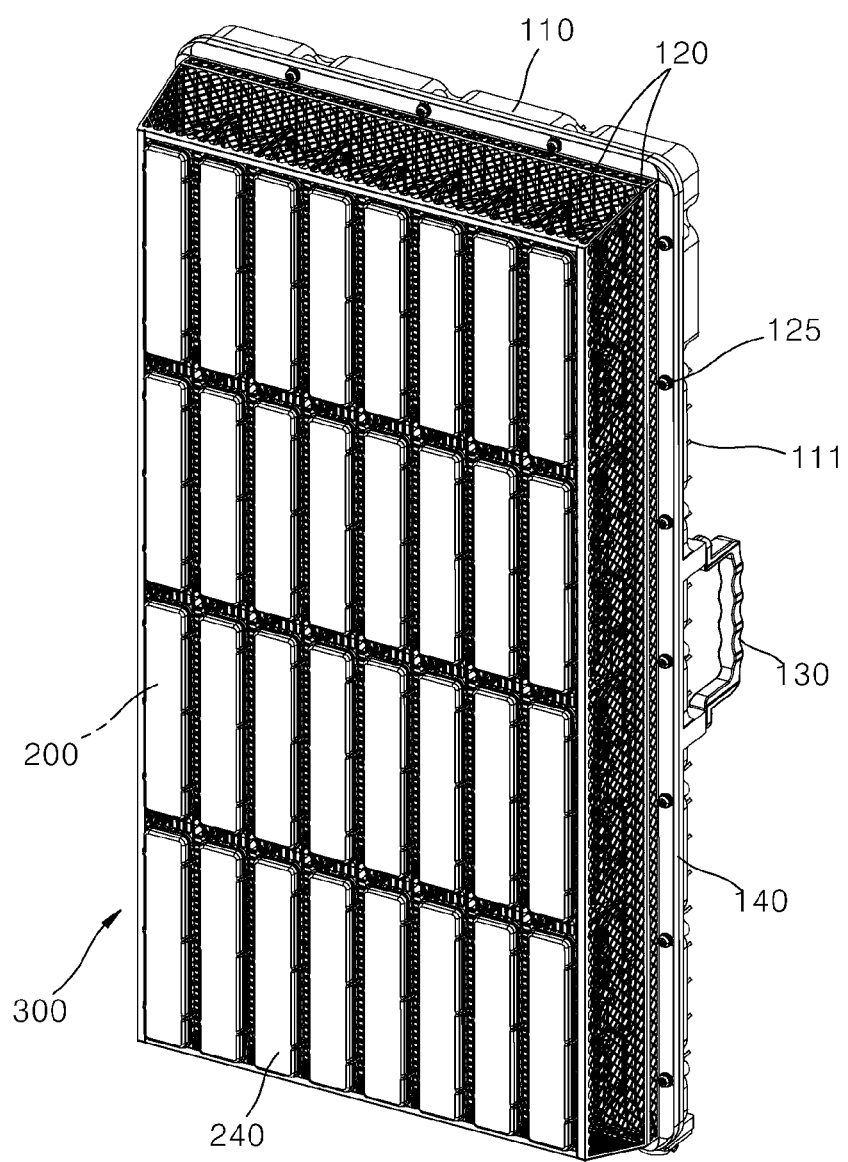
FIG. 2 is a perspective view illustrating an antenna apparatus according to a third embodiment of the present disclosure.
Figure 3:
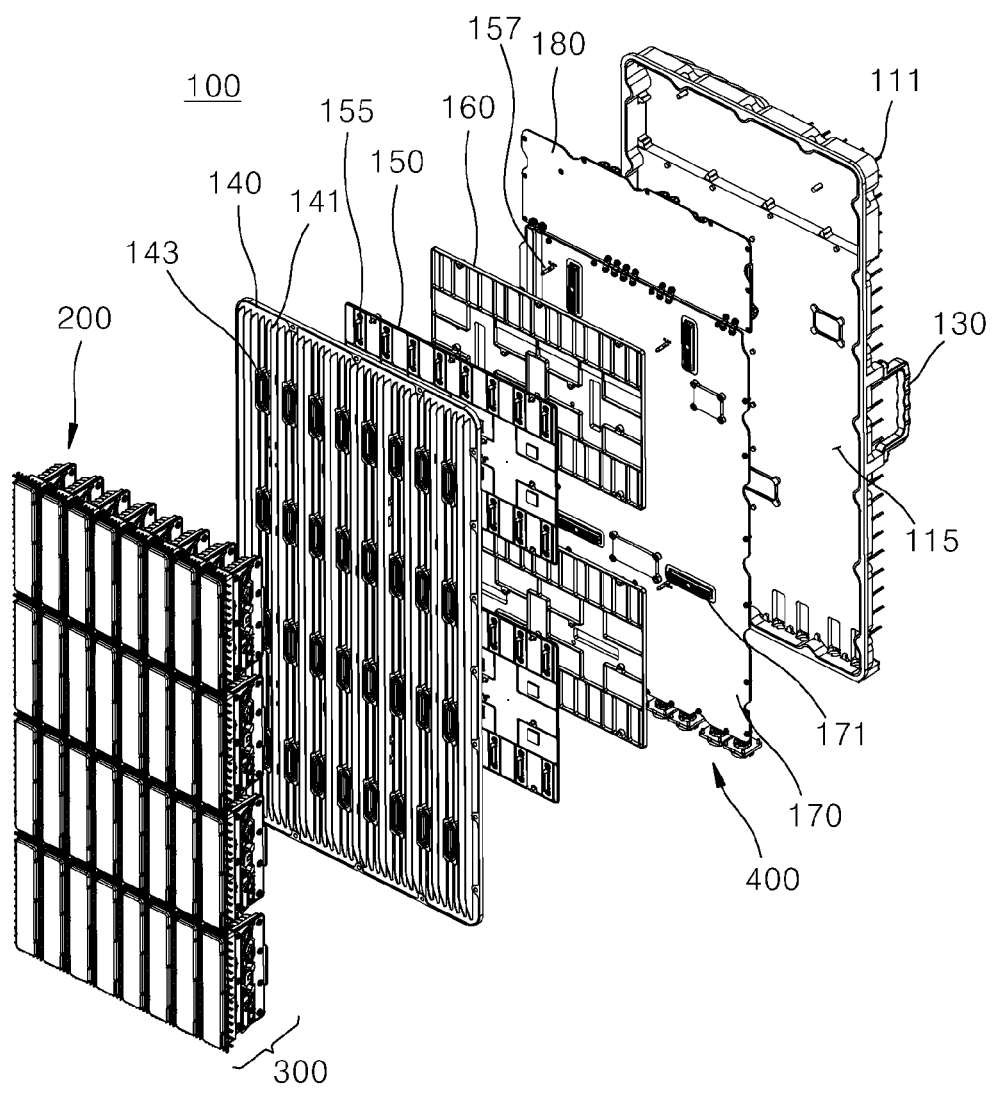
FIG. 3 is an exploded perspective view illustrating the antenna apparatus in FIG. 2.
Figure 4:
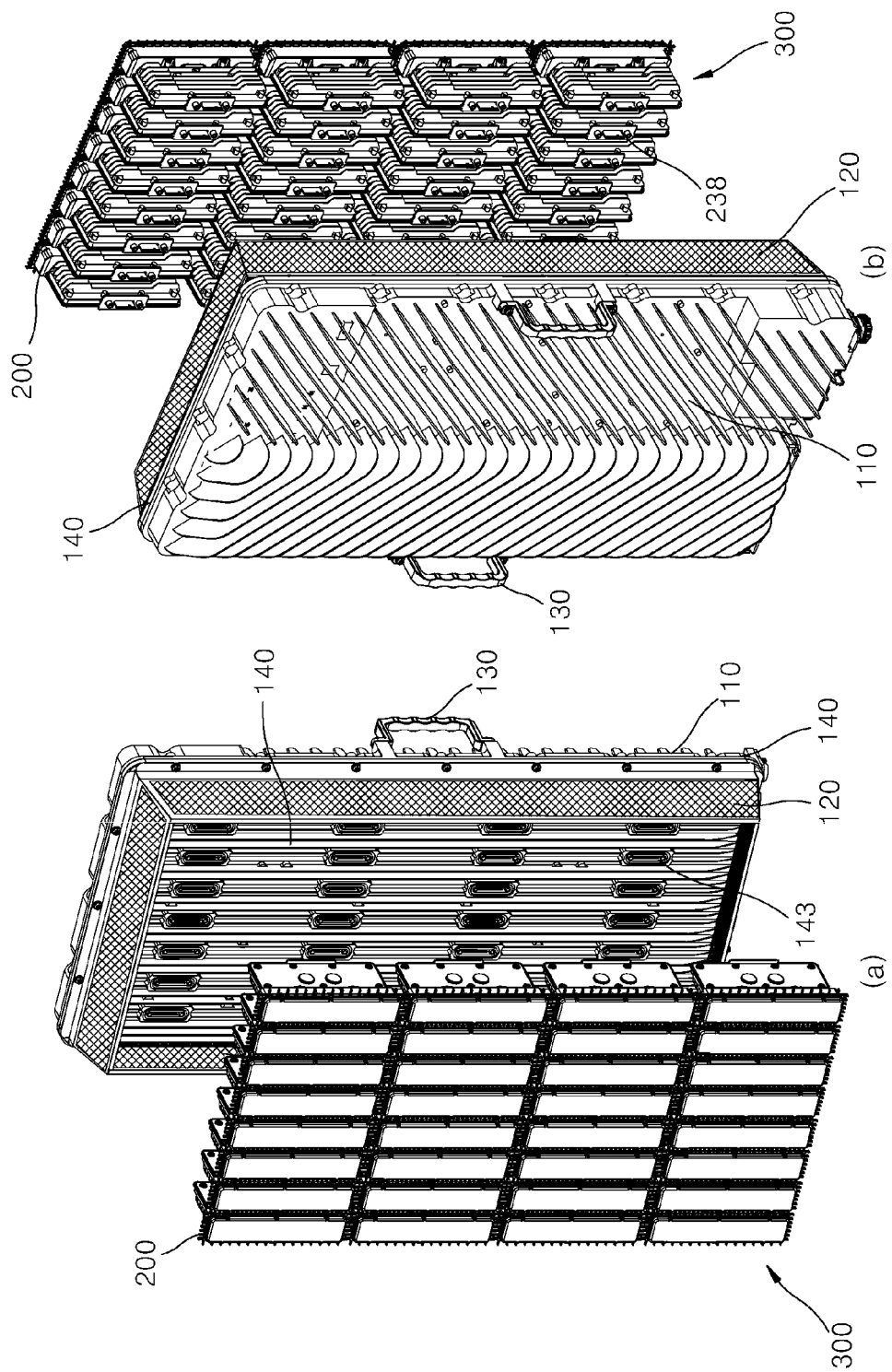
FIG. 4 is an exploded perspective view that is referred to for description of states where an antenna RF module assembly is attached to or detached from a front housing.
Figure 5:
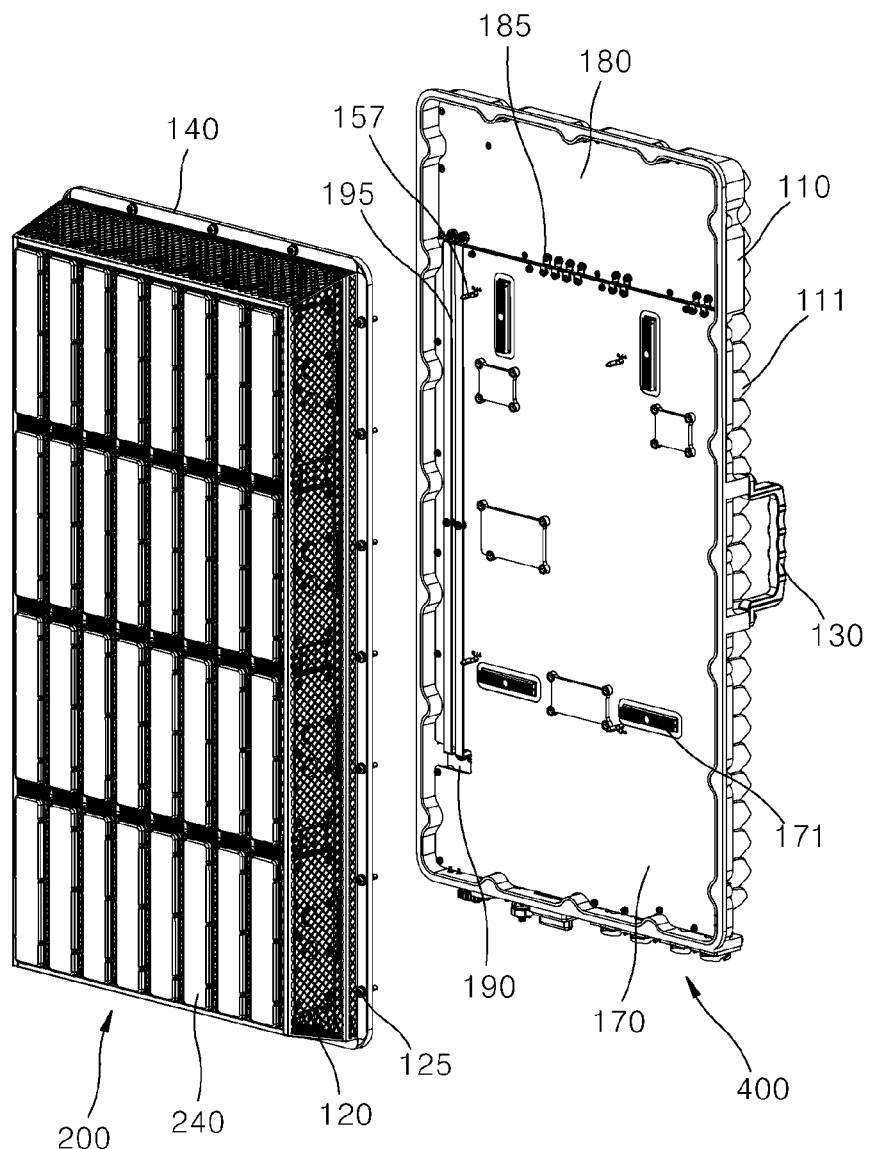
FIG. 5 is an exploded perspective view illustrating a state where the front housing and a rear housing are separated from each other.
Figure 6:
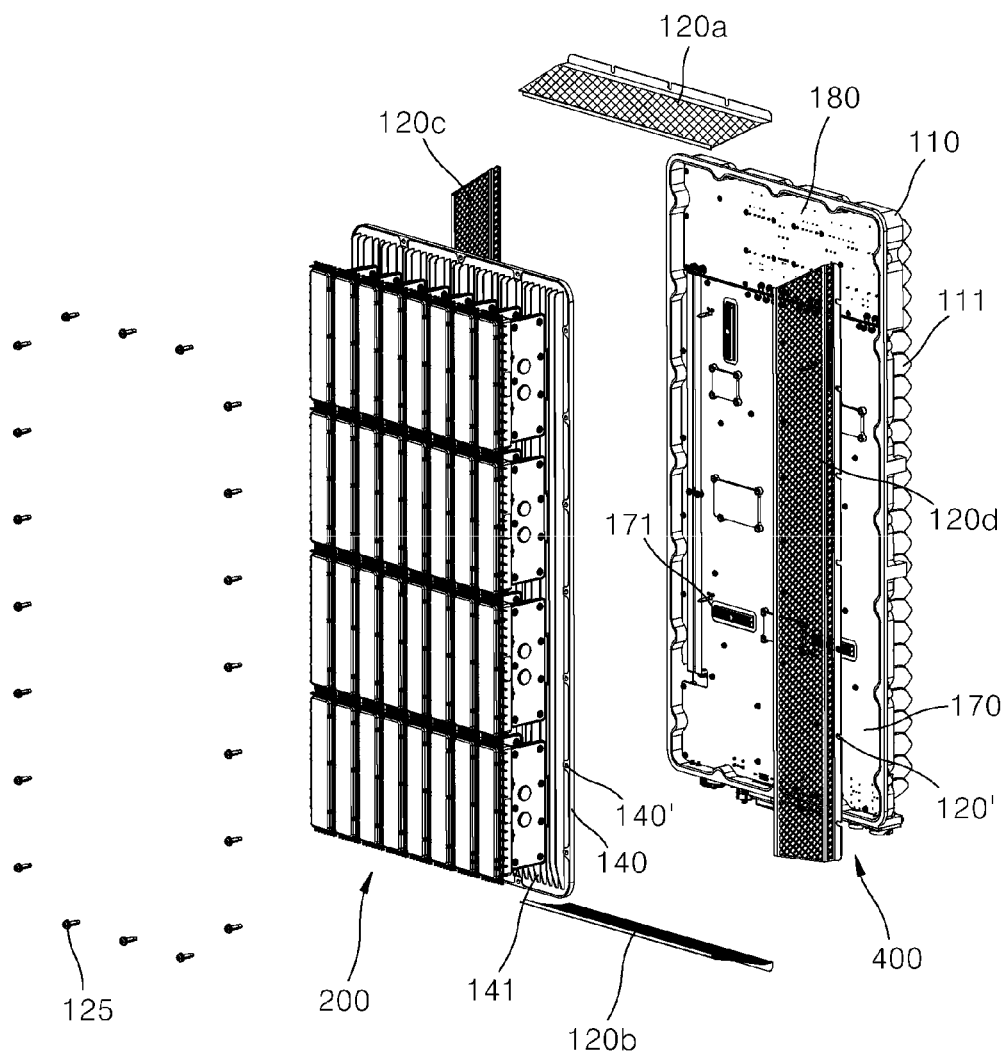
FIG. 6 is an exploded perspective view illustrating a state where the front housing is assembled to the rear housing.
Figure 7:
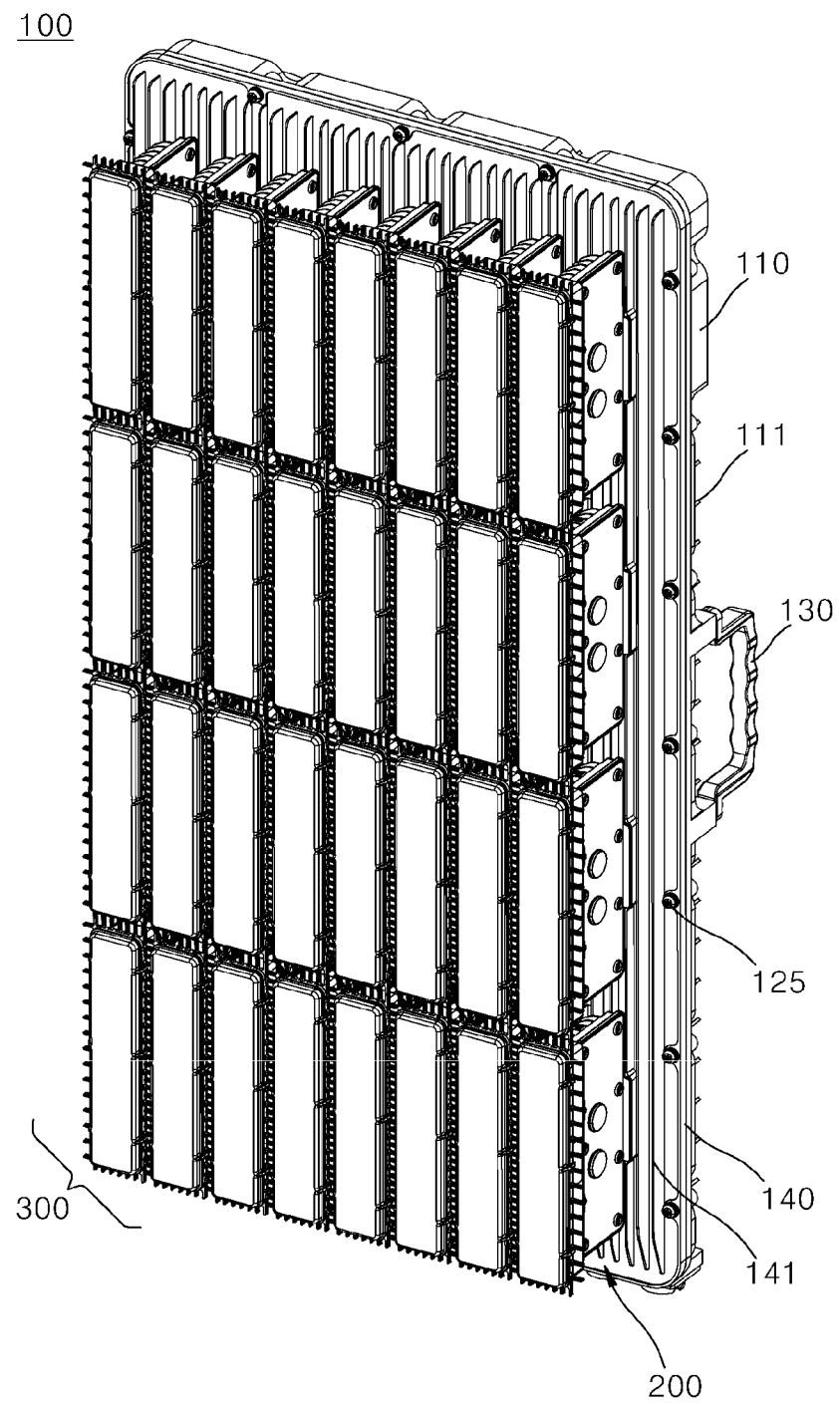
FIG. 7 is a perspective view illustrating a removed state of a ventilation panel, one of constituent elements in FIG. 2.
Figure 8A:
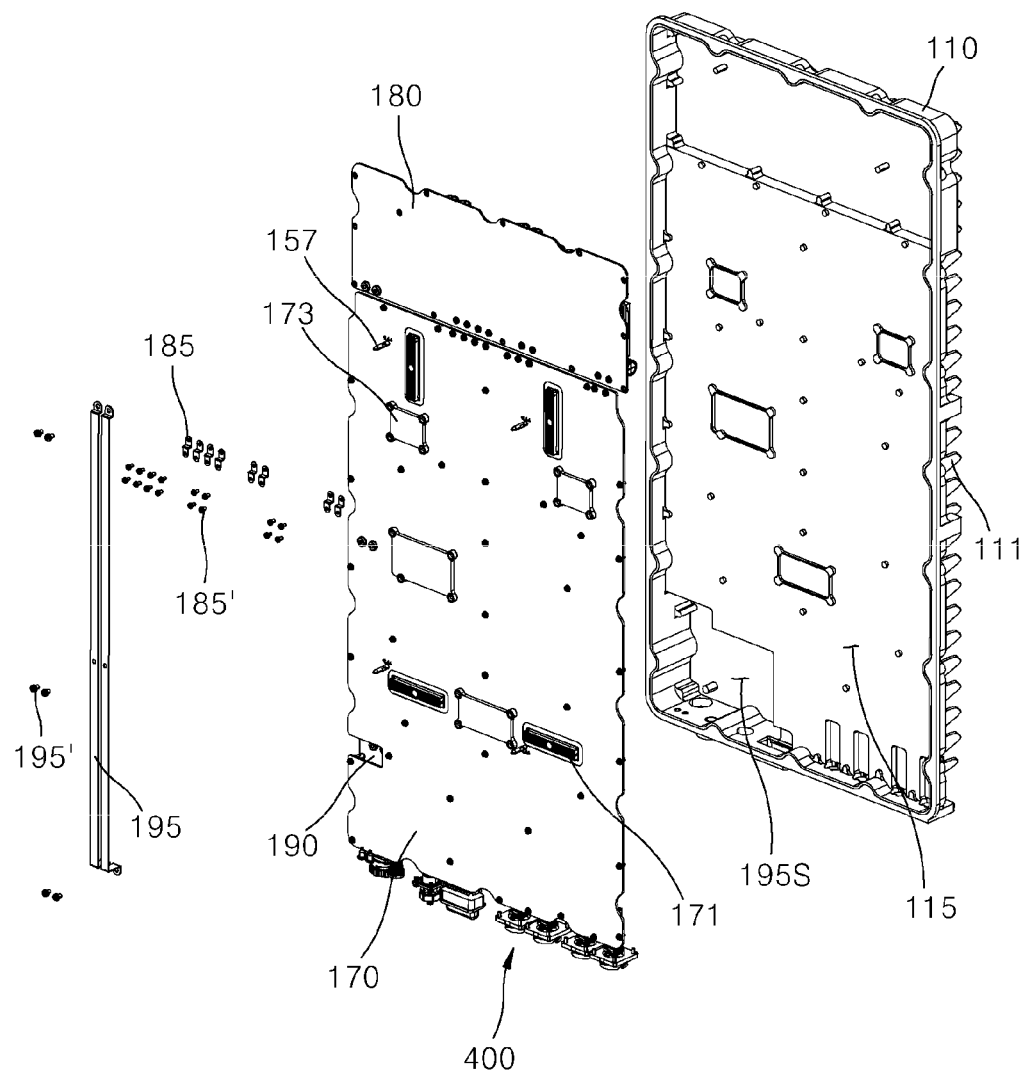
FIGS. 8a and 8b are exploded perspective views each illustrating relationships in which various boards are assembled to the rear housing.
Figure 8B:
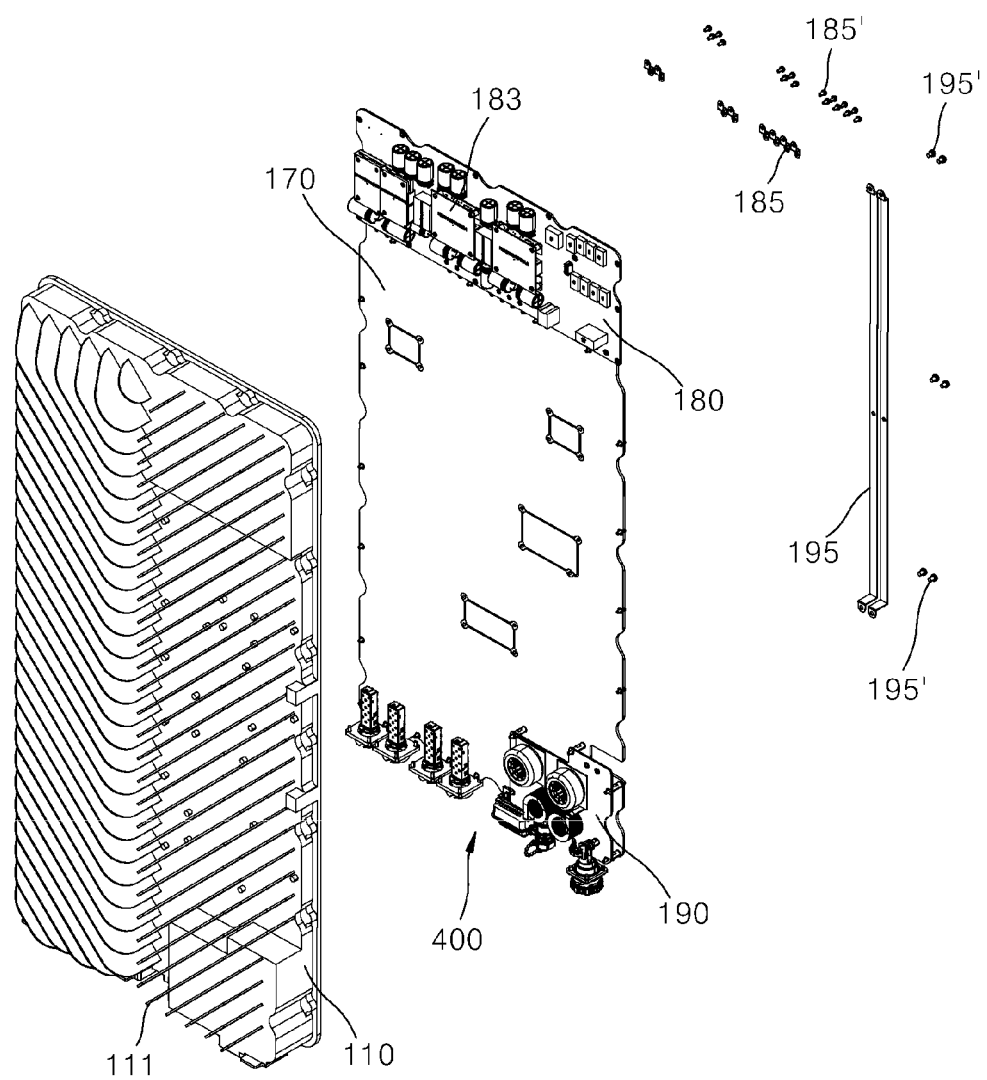
Figure 9:
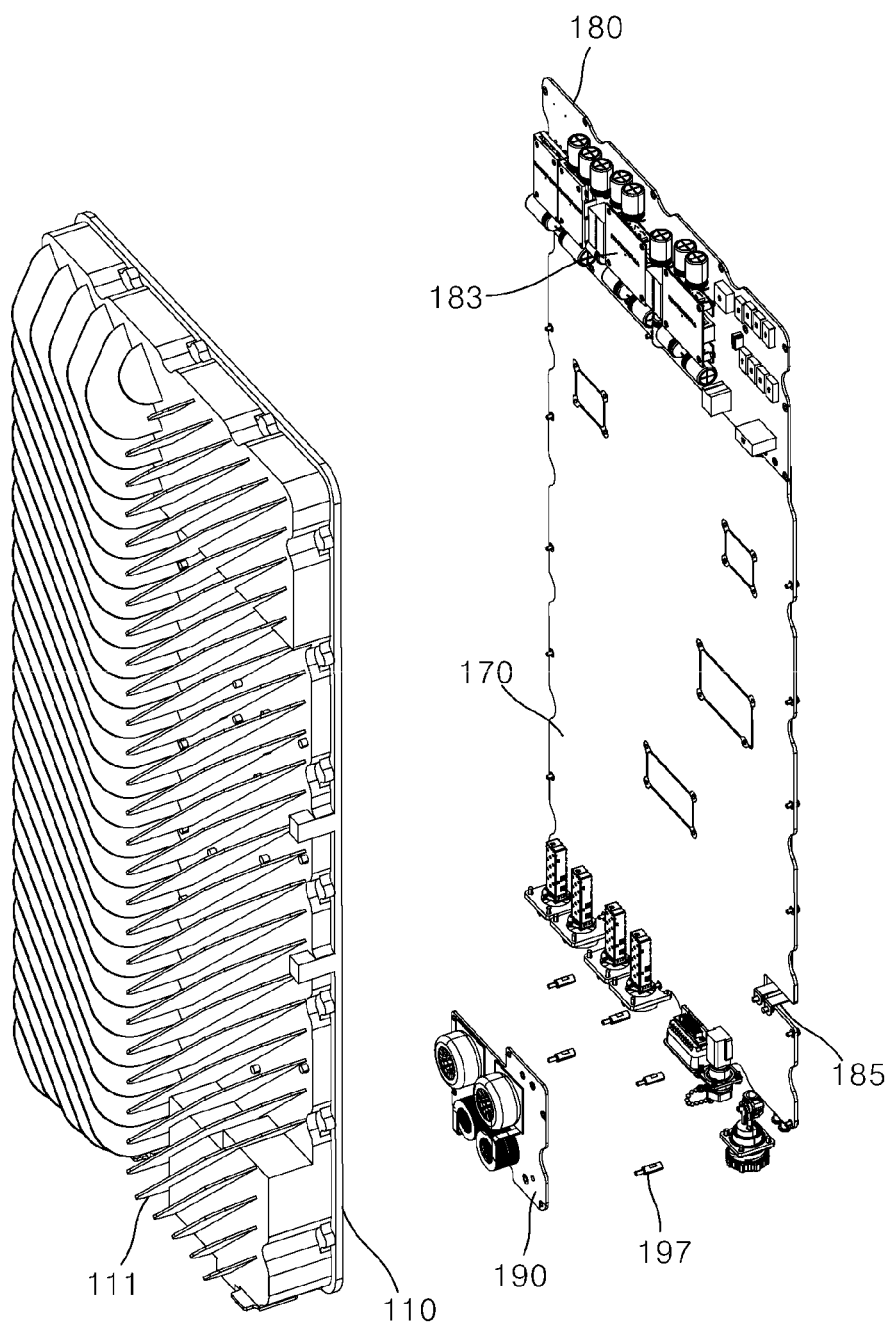
FIG. 9 is an exploded perspective view illustrating a combined state of a surge sub-board, one of the constituent elements in FIG. 2.
Figure 10:
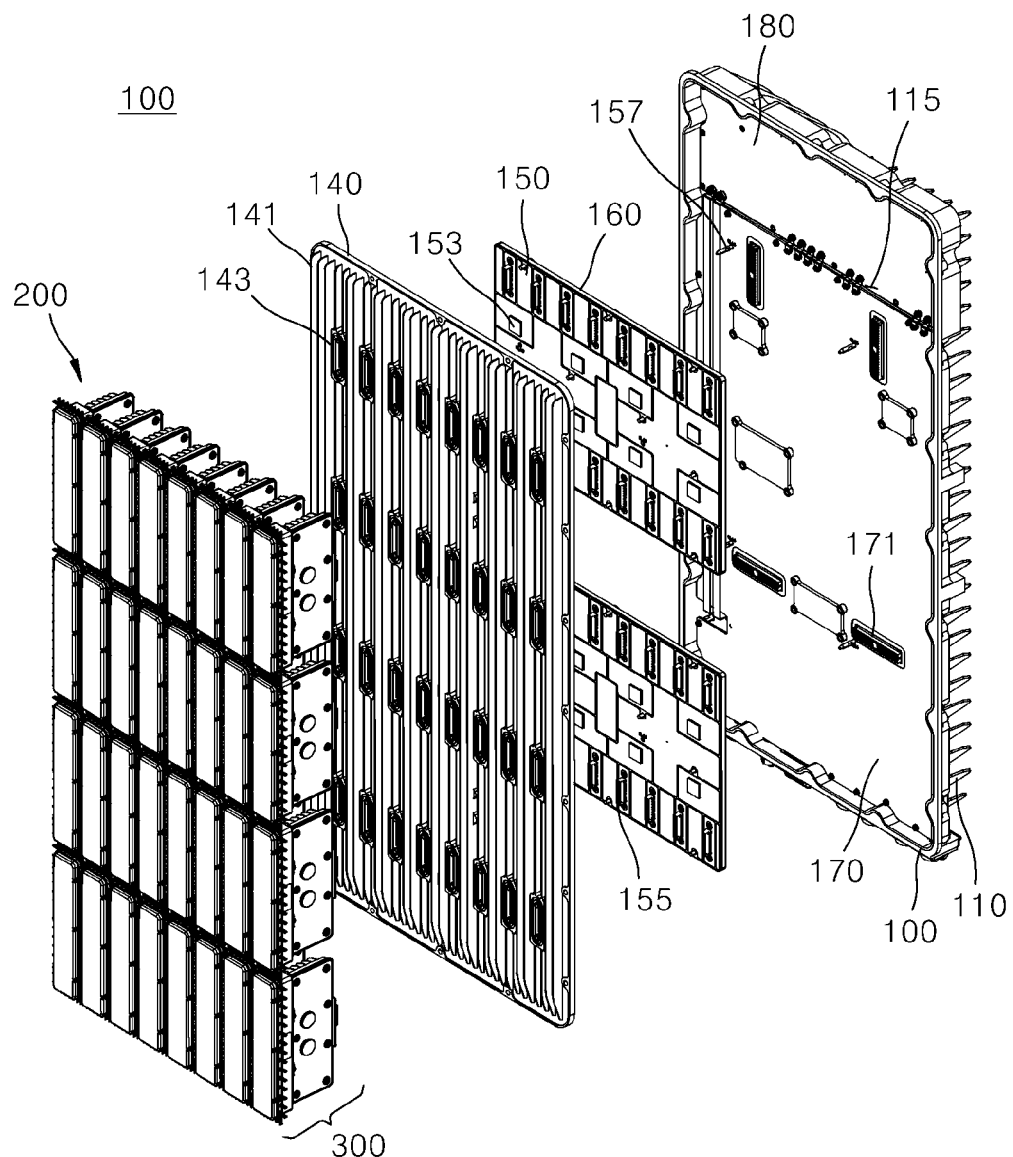
FIG. 10 is an exploded perspective view illustrating a position for combing an RFIC sub-board, one of the constituent elements in FIG. 2.
Figure 11:
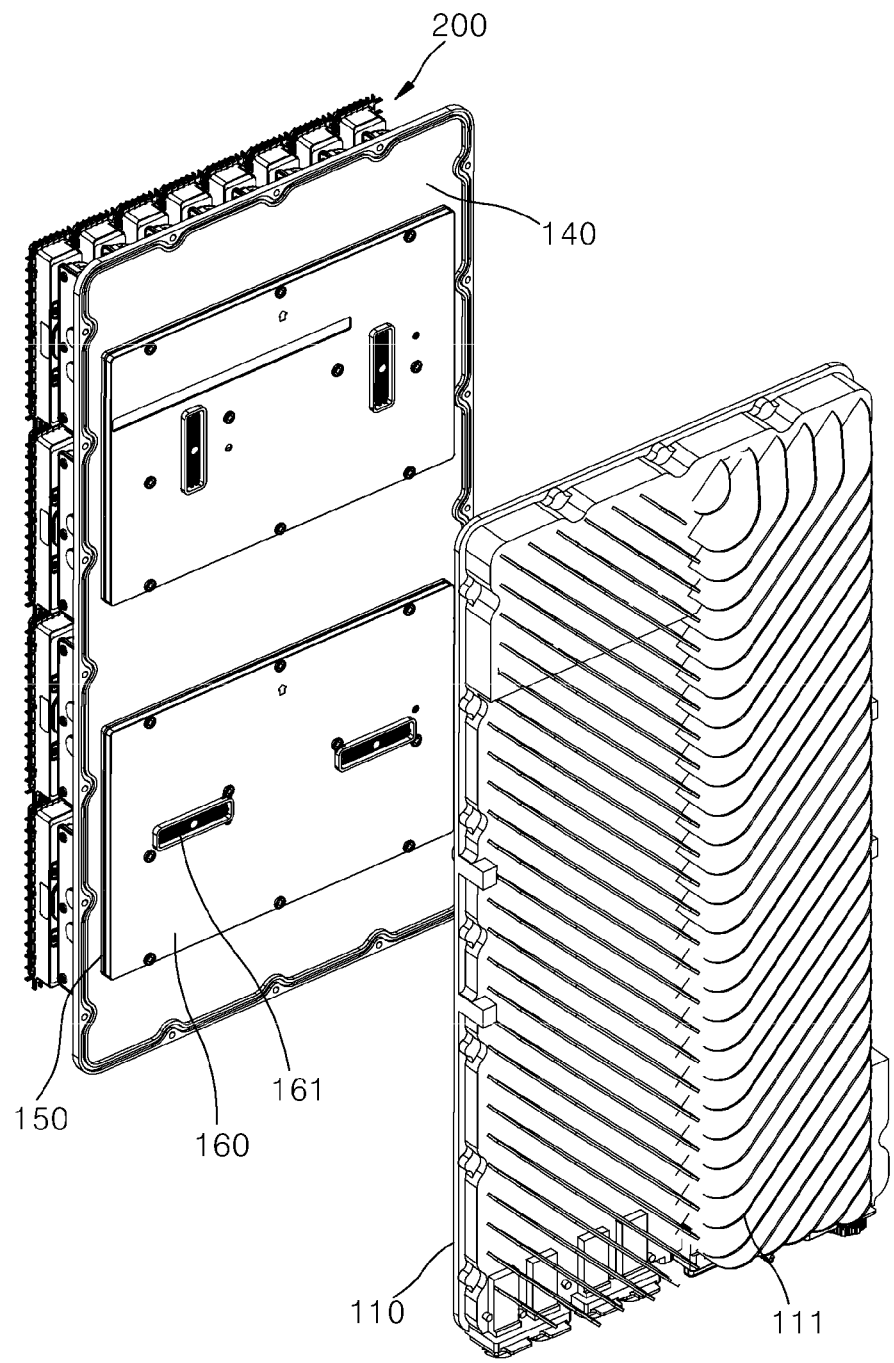
FIG. 11 is an exploded perspective view illustrating a state where the RFIC sub-board in FIG. 10 is combined with a rear surface of the front housing.

FIG. 2 is a perspective view illustrating the antenna apparatus 100 according to the third embodiment of the present disclosure. FIG. 3 is an exploded perspective view illustrating the antenna apparatus 100 in FIG. 2. FIG. 4 is an exploded perspective view that is referred to for description of states where the antenna RF module assembly 300 is attached to or detached from a front housing 140. FIG. 5 is an exploded perspective view illustrating a state . . . where the front housing 140 and a rear housing 110 are separated from each other. FIG. 6 is an exploded perspective view illustrating a state where the front housing 140 is assembled to the rear housing 110. FIG. 7 is a perspective view illustrating a removed state of a ventilation panel, one of constituent elements in FIG. 2. FIGS. 8*a* and 8*b* are exploded perspective views each illustrating relationships in which various boards are assembled to the rear housing 110. FIG. 9 is an exploded perspective view illustrating a combined state of a surge sub-board 190, one of the constituent elements in FIG. 2. FIG. 10 is an exploded perspective view illustrating a position for combining an RFIC sub-board 150, one of the constituent elements in FIG. 2. FIG. 11 is an exploded perspective view illustrating a state where the RFIC sub-board in FIG. 10 is combined with a rear surface of the front housing 140.

The antenna apparatus 100 according to the third embodiment, as illustrated in FIGS. 2 to 7, includes the rear housing 110 that forms a rear exterior appearance of the antenna apparatus 100 and the front housing 140 that forms one portion of a front exterior appearance of the antenna apparatus 100.

In addition, the antenna apparatus 100 further includes a main board 170 that is adhesively installed in an installation space 115 in the rear housing 110, a power supply unit (PSU) sub-board 180 that is arranged on top of the main board 170, the surge sub-board 190 that is arranged to be spaced more backward than the main board 170, the RFIC sub-board 150 that is adhesively arranged on the rear surface of the front housing 140, and the antenna RF modules (hereinafter referred to as "RF modules") 200 that are arranged in a stacked manner on a front surface of the front housing 140.

The rear housing 110 and the front housing 140 are combined with the RF module 200. Thus, the rear housing 110 and the front housing 140 form the exterior appearance of the entire antenna apparatus 100 and may serve as an intermediary for combination with a support pole that, although not illustrated, is provided to install the antenna apparatus 100. However, as long as there is no restriction on space for installation of the antenna apparatus 100, an assembly of the rear housing 110 and the front housing 140 is not necessarily combined with the support pole. It is also possible that the assembly of the rear housing 110 and the rear housing 140 is directly installed in a wall-mounted manner on or fixed to a vertical structure, such as an inside or outside wall of a building. Particularly, it is significantly meaningful that the antenna apparatus 100 according to the third embodiment of the present disclosure is designed for slimness in such a manner as to have a minimized thickness in the forward-backward direction in order to be easily installed in a wall-mounted manner. The installation of the antenna apparatus 100 in a wall-mounted manner will be described in detail below.

The rear housing 110 and the front housing 140 are made of a metal material having an excellent heat transfer property in such a manner as to advantageously dissipate heat through an overall area thereof by heat transfer. Moreover, the rear housing 110 and the front housing 140 are formed in the form of a rectangular parallelepiped-shaped casing with a small thickness substantially in the forward-backward direction.

Particularly, the rear housing 110 is formed to be open at the front surface thereof. Thus, the rear housing 110 has the predetermined installation space 115. Thus, the rear housing 110 serves as an intermediary for installation of the main board 110 on which a digital element (for example, a field programmable gate array (FPGA) 173 is mounted, the PSU sub-board 180 on which PSU elements are mounted, and the surge sub-board 190 on which surge elements are mounted.

Although not illustrated in the drawings, the rear housing 110 may be formed in such a manner that an internal surface thereof shape-fits on an externally protruding portion of the digital element (the FPGA 173 or the like) that is mounted on a rear surface of the main board 170, a PSU 183, and the like that are mounted in a rear surface of the PUS sub-board 180 and on externally protruding portions of the surge elements that are mounted on a rear surface of the surge sub-board 190. The reason for this is to maximally increase an area, for heat transfer, of the inside surface of the rear housing 110 that is brought into contact with respective rear surfaces of the main board 170, the PSU sub-board 180, and the surge sub-board 190 and thus to maximize performance in heat dissipating.

A handle 130 may be further installed on both the left and right sides of the rear housing 110. An operator on the spot uses the handle 130 when transporting the antenna apparatus 100 according to the third embodiment of the present disclosure or in order to facilitate manual mounting of the antenna apparatus 100 on the support pole (not illustrated) or the inside or outside wall of the building.

Moreover, various outside mounting members 400 for connecting a cable to an apparatus of a base station (not illustrated) and for regulating an internal component may be assembled to the outside of a lower end portion of the antenna housing 110 and 140 by passing therethrough. The outside mounting member 400 is provided in the form of at least one optical-cable connection terminal (socket). Connection terminals for coaxial cables (not illustrated) may be connected to the connection terminals, respectively.

With reference to FIG. 2, a multiplicity of rear heat dissipation pins 111 may be integrally formed with a rear surface of the rear housing 110 in such manner as to have a predetermined pattern. In this case, heat generated from respective heat generating elements of the main board 170, the PSU sub-board 180, and the surge sub-board 190 that are installed in the installation space 115 in the rear housing 110 may be directly dissipated toward the rear direction through the multiplicity of rear heat dissipation pins 111.

The multiplicity of rear heat dissipation pins 111, as illustrated in FIG. 4(*b*), are arranged in such a manner that the rear heat dissipation pins 111 on the left side of the rear surface of the rear housing 110 are inclined upward toward the right side thereof and that the rear heat dissipation pins 111 on the right side of the rear surface of the rear housing 110 are inclined upward toward the left side thereof. The multiplicity of rear heat dissipation pins 111 may be designed in such a manner that the heat dissipated toward the rear of the rear housing 110 dispersedly forms ascending air currents toward the leftward and rightward direction, respectively, of the rear housing 110 and thus is dispersed more quickly. However, the multiplicity of rear heat dissipation pins 111 are not necessarily limited to formation in this arrangement. For example, although not illustrated in the drawings, in a case where a forced-draft fan module (not illustrated) is further provided to the side of the rear surface of the rear housing 110 in order to facilitate a flow of outside air, a configuration may be employed in which the multiplicity of rear heat dissipation pins 111 are parallelly formed on the left and right sides of the rear surface thereof, with the forced-draft fan module arranged on the center of the rear surface thereof, in such a manner that the heat dissipated by the forced-draft fan module is discharged more quickly.

In addition, although not illustrated, a mounting unit (not illustrated) with which a clamping device (not illustrated) for combing the antenna apparatus 100 with the support pole (not illustrated) is combined may be integrally formed with some of the multiplicity of rear heat dissipation pins 111. In this case, the clamping device may be configured to adjust the directivity of the antenna apparatus 100 according to the third embodiment of the present disclosure, which is installed on an upper end portion of the clamping device, by rotating the antenna apparatus 100 in a leftward-rightward direction or by tilting the antenna apparatus 100 in an upward-downward direction.

However, the clamping device for tilting or rotating the antenna apparatus 100 is not necessarily combined with the mounting unit. For example, in a case where the antenna apparatus 100 is installed on the inside or outside wall of the building in a wall-mounted manner, it is also possible that a clamp panel in the form of a latch-shaped plate that is easy to combine in a wall-mounted manner is combined with the mounting unit.

As a first implementation example, the antenna apparatus 100, as illustrated in FIGS. 1 to 7, may further include the surge sub-board 190 that is adhesively arranged on the front surface of the rear housing 110 in the installation space 115 in the rear housing 110 in such a manner as to be spaced apart from the back of the main board 170, and the PSU sub-board 180 that is arranged on top of the main board 170 in the installation space 115 in the rear housing 110 such a manner as to have a front surface that is matched with a front surface of the main board 170.

In this case, the surge sub-board 190 may be arranged in such a manner that a front end portion thereof is supported on a rear surface of the main board 170 and that, with a multiplicity of separation supports supported on a front surface of the surge sub-board 190, a rear end portion thereof is arranged to be spaced a predetermined distance away from the back of the main board 170.

As illustrated in FIGS. 8*a* and 8*b*, the surge sub-board 190 and the PSU sub-board 180 may be electrically connected to each other with at least one of bus bars 195 and 185 in between. The main board 170 and the PSU sub-board 180 may be electrically connected to each other with at least one of bus bars 195 and 185 in between.

More specifically, the surge sub-board 190 is arranged at a relatively high height in the installation space 115 in the rear housing 110, with the surge sub-board 190 and the PSU sub-board 180 being positioned with the main board 170 in between. Conversely, the PSU sub-board 180 is arranged at a relatively low height in the installation space 115 in the rear housing 110, with the PSU sub-board 180 and the surge sub-board 190 being positioned with the main board 170 in between. Accordingly, the surge sub-board 190 and the PSU sub-board 180 may be electrically connected to each other with the long-sized bus bar 195. The long-sized bus bar 195 may be stably fixed because each of the end portions and middle portion thereof are fastened by a multiplicity of bus bar fastening screws 195'.

In addition, the PSU sub-board 180 may be arranged in a manner that is brought into direct contact with an upper end of the main board 170 and thus may be electrically connected to the main board 170 with the short-sized bus bar 185. The short-sized bus bar 185 may be stably fixed because each of the end portions thereof is fastened by a multiplicity of bus bar fastening screws 185'.

As a second implementation example, the antenna apparatus 100 according to the third embodiment of the present disclosure, as illustrated in FIGS. 10 and 11, may further include the RFIC sub-board 150 that is arranged to be spaced away from the front of the main board 170 in the installation space 115 in the rear housing 110, but adhesively arranged on the rear surface of the front housing 140.

RFICs 153 that correspond to the FPGA 173, respectively, that are mounted on the main board 170 may be arranged on the RFIC sub-board 150 in a manner that is mounted thereon. The RFIC sub-board 150 may be arranged in such a manner that the RFICs 153 that are mounted, together with the FPGAs 173 described above, on a front surface or rear surface of a main board 170 in the related art are separated from the main board 170, but, for heat transfer, are brought into surface contact with the rear surface of the front housing 140 that is substantially an essential constituent element for dissipation of heat toward a front direction.

In this case, the RFIC sub-board 150, as illustrated in FIG. 10, may be arranged in such a manner that a front end portion thereof is supported on the rear surface of the front housing 140 and that, with the multiplicity of separation supports 157 supported on the front surface of the main board 170, a rear end portion thereof is spaced a predetermined distance away from the front of the main board 170. In this manner, thermal separation between the RFIC sub-board 150 and the main board 170 may be achieved by arranging the RFIC sub-board 150 in such a manner as to be spaced away from the front of the main board 170.

As illustrated in FIG. 11, electrical connection to the main board 170 may be possible with passing-through of a thermal separation plate 160 provided on the back of the RFIC sub-board 150 for physical thermal separation from the main board 170.

More specifically, as illustrated in FIG. 10, a multiplicity of intermediary female sockets 155 that are combined, in a socket-pin coupling manner, with a multiplicity of male sockets respectively, on an amplification unit board 235, one of constituent elements of the RF module 200, may be formed on a front surface of the RFIC sub-board 150. Moreover, an intermediary male socket 161 that is combined, in a socket-pin coupling manner, with a frontmost female socket 171 formed on the front surface of the main board 170 may be formed on a rear surface of the RFIC sub-board 150. In this case, the intermediary male socket 161 may be formed on the rear surface of the RFIC sub-board 150, but may pass through the thermal separation plate 160 and thus be exposed at a rear surface of the thermal separation plate 160, in such a manner as to be combinable, in a socket-pin coupling manner, with the front female socket 171 of the main board 170.

The intermediary female socket 155 formed in the RFIC sub-board 150 may be exposed toward the front direction through a socket through-hole 143 (refer to FIG. 12 that follows) formed in the front housing 140. In this manner, the male socket 235a on the amplification unit board 235 may be combined, in a socket-pin coupling manner, with the intermediary female socket 155 exposed toward the front direction.

It is desired that the thermal separation plate 160 is made of a thermal insulating material in such a manner as to prevent heat generated from the RFIC sub-board 150 from dissipating toward the installation space 115 in the rear housing 110 that is a rear space that is positioned at a relatively remote distance in the rear direction and to immediately guide dissipating of the heat toward the front direction through the front housing 140.

The front housing 140 serves to separate the main board 170, the PSU sub-board 180, the surge sub-board 190, and the RF module 200 in the front direction that are seated in the installation space 115 in the rear housing 110 by being separated therein. In addition, the front housing 140 may be provided in such a manner as to separate the installation space 115 positioned to the side of the rear housing 110 and the other space from each other. Thus, the front housing 140 may perform thermal blocking and thermal separation functions, in such a manner that heat generated in the installation space 115 positioned toward the direction of the rear housing 110 does not have an influence toward the RF module 200.

It is desired that the "thermal blocking" here is understood as meaning that heat generated from the RF module 200 positioned in outside air in front (or a space in front) that is defined as a space in front of the front surface of the front housing 140 is blocked from being transferred toward a space in the rear surface of the front housing 140 (that is, toward the installation space 115 in the rear housing 110). Moreover, it is desired that, for a separate thermal configuration, the "thermal separation" here is understood as meaning that some of a multiplicity of elements from which heat is generated during operation and which are originally mounted in a concentrated but dispersed manner on the front and rear surfaces of the main board 170 adhesively installed in the installation space 115 in the rear housing 110 are configured to be separately arranged in such a manner as to possibly dissipate the heat not only in the rear direction, but also in the front direction.

A multiplicity of front heat dissipation pins 141 may be integrally formed on the front surface of the front housing 140. The front housing 140 and the multiplicity of the front heat dissipation pins 141 are made of a metal material having an excellent heat transfer property. Thus, the heat in the installation space 115 in the rear housing 110 or the heat generated from the RFICs 153 may be easily dissipated toward the front direction in a manner that transfers heat, with the front housing 140 serving as an intermediary for heat transfer.

As a third implementation example, the antenna apparatus 100 according to the third embodiment of the present disclosure, as illustrated in FIG. 6, may further include at least one of ventilation panels 120 (ventilation panels 120a to 120d). Front end portions of the multiplicity of RF modules 200 are positioned in such a manner as to be spaced further away, toward the front direction, from an edge of the front housing 140. At least one of the ventilation panels 120 (ventilation panels 120a to 120d) is combined with an edge portion of the front housing 140, but may be combined in a manner that surrounds lateral sides of a multiplicity of outermost RF modules 200.

In the antenna apparatus 100, as a fourth implementation example, according to the third embodiment of the present disclosure, as illustrated in FIG. 6, the first ventilation panel 120a and the second ventilation panel 120b are combined with respective upper and lower portions, respectively, of the uppermost and lowermost RF modules 200, among a multiplicity of RF modules 200 that are combined with the front surface of the front housing 140, in such a manner that the respective upper and lower portions thereof are closed. Moreover, the third ventilation panel 120c and the fourth ventilation panel 120d are combined with respective left and right portions, respectively, of the leftmost and rightmost RF modules 200, among the multiplicity of RF modules 200 that are combined with the front surface of the front housing 140, in such a manner that the respective upper and lower portions thereof are closed.

In this case, a ventilation hole (to which a reference number is not assigned) having a predetermined size is wholly formed in at least one of the ventilation panels 120 (ventilation panels 120a to 120d). Accordingly, through the ventilation hole, outside air in the external space may be introduced toward the front of the housing 140, or the heat dissipated toward the front of the front housing 140 may be smoothly discharged toward the external space. Thus, outside air ventilation can be enhanced. The enhancing of the outside air ventilation can greatly improve the performance in dissipating the heat toward the front of the front housing 140.

In addition, as described below, since the RF module 200 is exposed to the outside air in front that is defined as a space in front of the front surface of the front housing 140, at least one of the ventilation panels 120 is arranged in such a manner as to close at least the lateral side of the RF module 200 exposed to the outside in front, and thus may serve to block an outside foreign material from being introduced toward the front of the front housing 140 and to block an non-credentialed person who is unauthorized to access the antenna apparatus 100 from accessing the RF module 200.

In this case, as illustrated in FIG. 5, a multiplicity of fastening screws 125 are sequentially fastened into ventilation panel fastening grooves 120', respectively, formed on a rear end portion of at least one of the ventilation panels 120 and ventilation panel fastening holes 140', respectively, formed to be spaced apart along an end portion of an edge of the front housing 140. Thus, at least one of the ventilation panels 120 may be combined with the edge portion of the front housing 140.

Furthermore, as illustrated in FIG. 7, at least one of the ventilation panels 120 is provided in such a manner that a reflector grill pin 224 integrally formed on an RF filter 220, one of the constituent elements of the RF module 200, that is described below, and the front housing 140 are arranged to be spaced away from each other. Therefore, a front end portion of the ventilation panel 120 may be combined with the reflector grill pin 224 by being brought into electric contact therewith, in such a manner that the reflector grill pin 224 serves to smoothly perform a grounding (GND) function, one of functions of the reflector grill pin 224.

Figure 12:
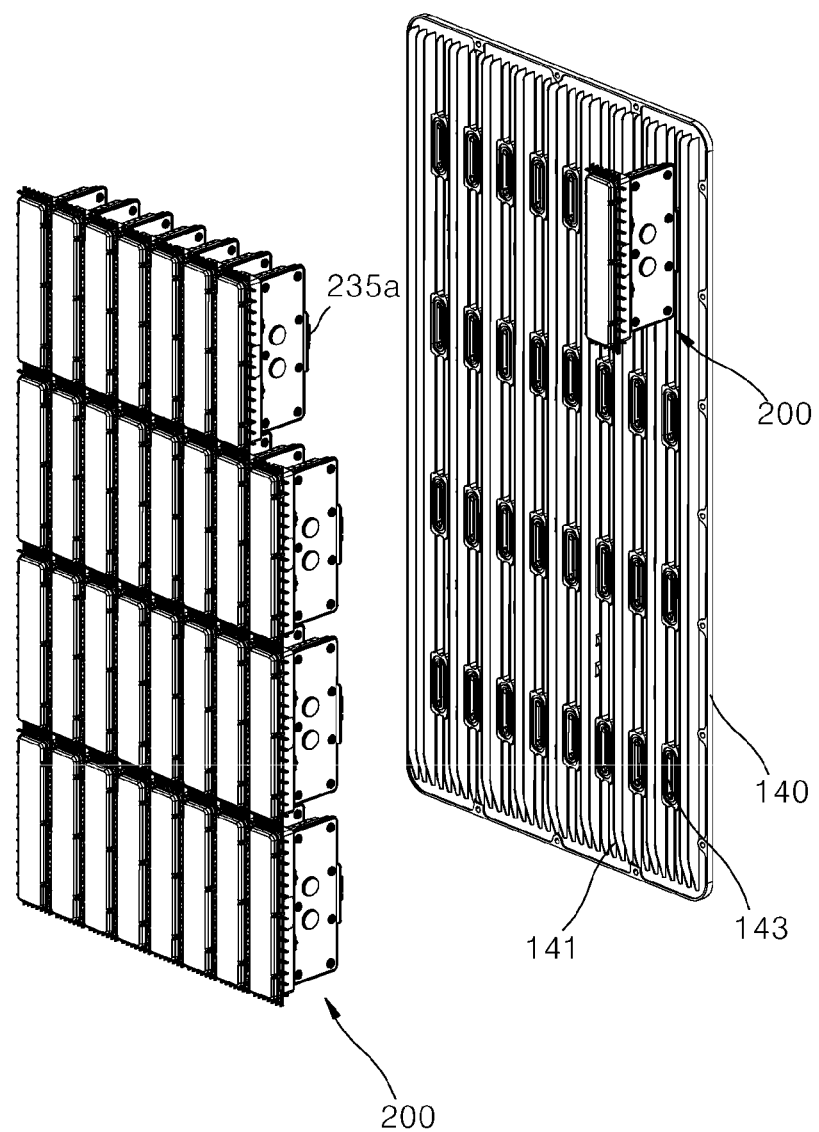
FIG. 12 is an exploded perspective view illustrating a state where an RF module, one of the constituent elements in FIG. 2, is installed in the front housing.
Figure 14:
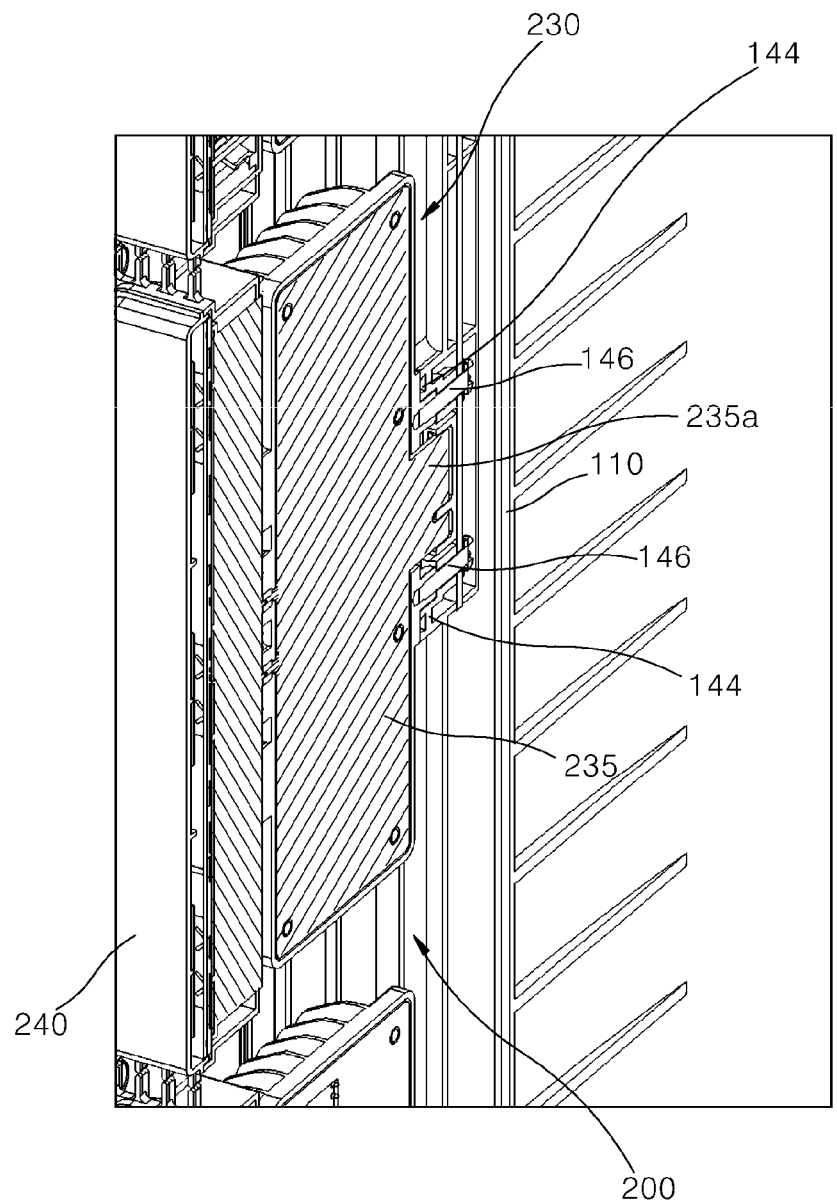
FIG. 14 is a cut-away perspective view illustrating a state where the RF module is combined with a main board.
Figure 15:
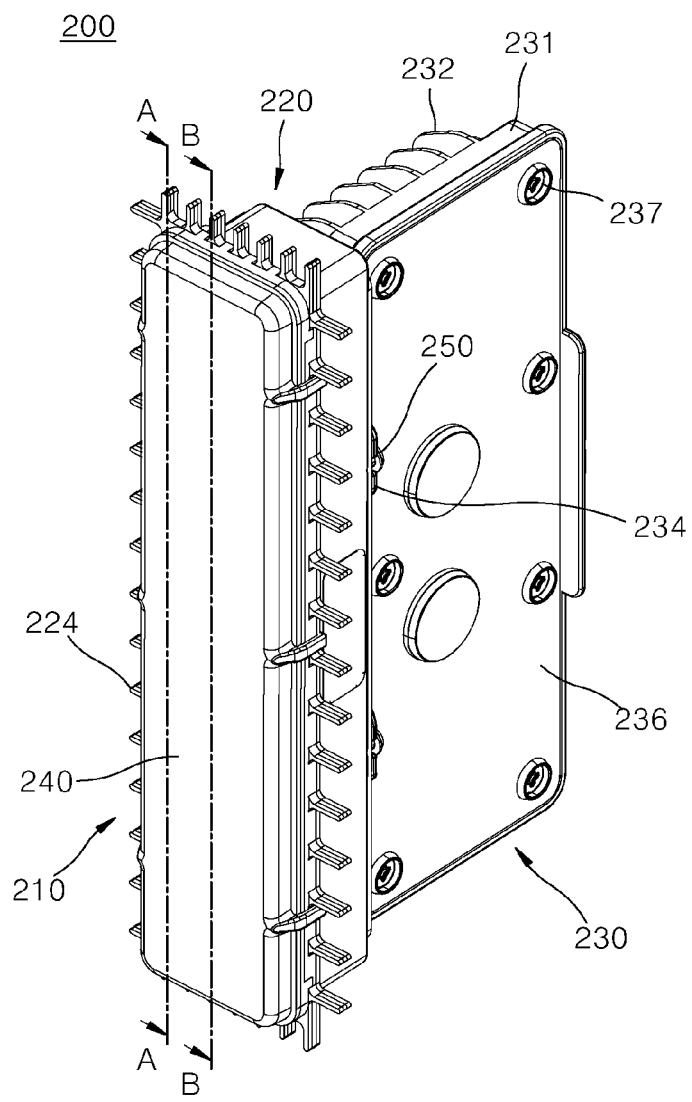
FIG. 15 is a perspective view illustrating the RF module as a single unit, one of the constituent elements in FIG. 2.
Figure 16:
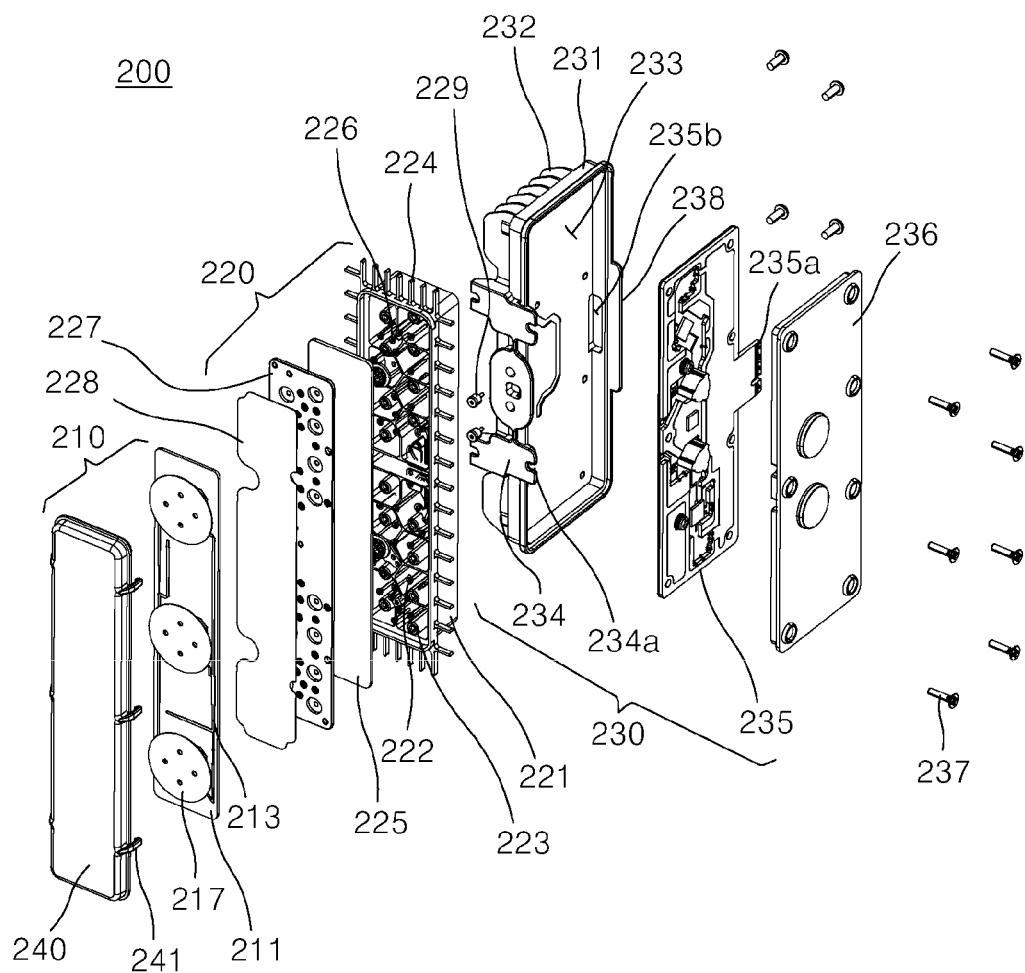
FIG. 16 is an exploded perspective view illustrating the RF module, as a single unit, in FIG. 15.
Figure 17A:
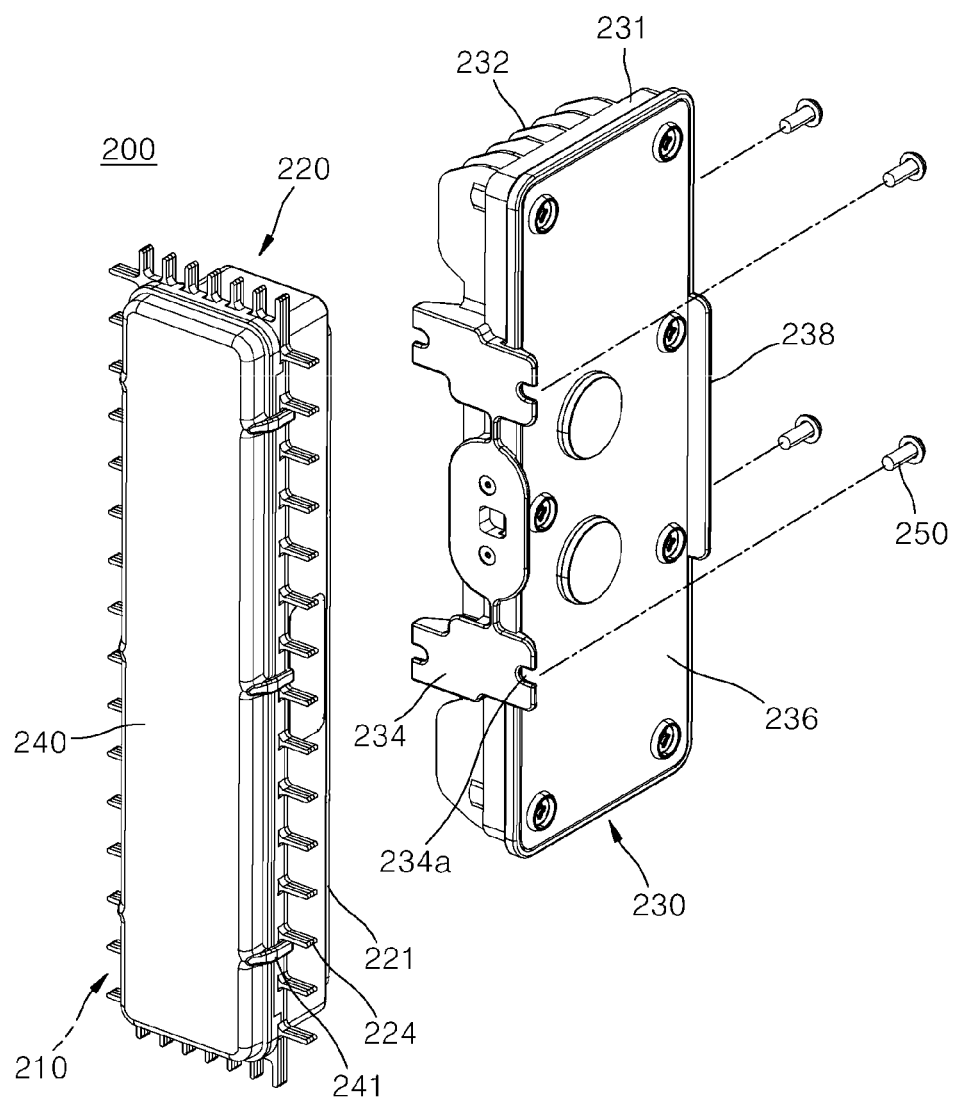
FIGS. 17a to 17d are exploded perspective views illustrating a state where a radiation element module, an RF module, and an amplification element module, which constitute the RF module, are installed.
Figure 17B:
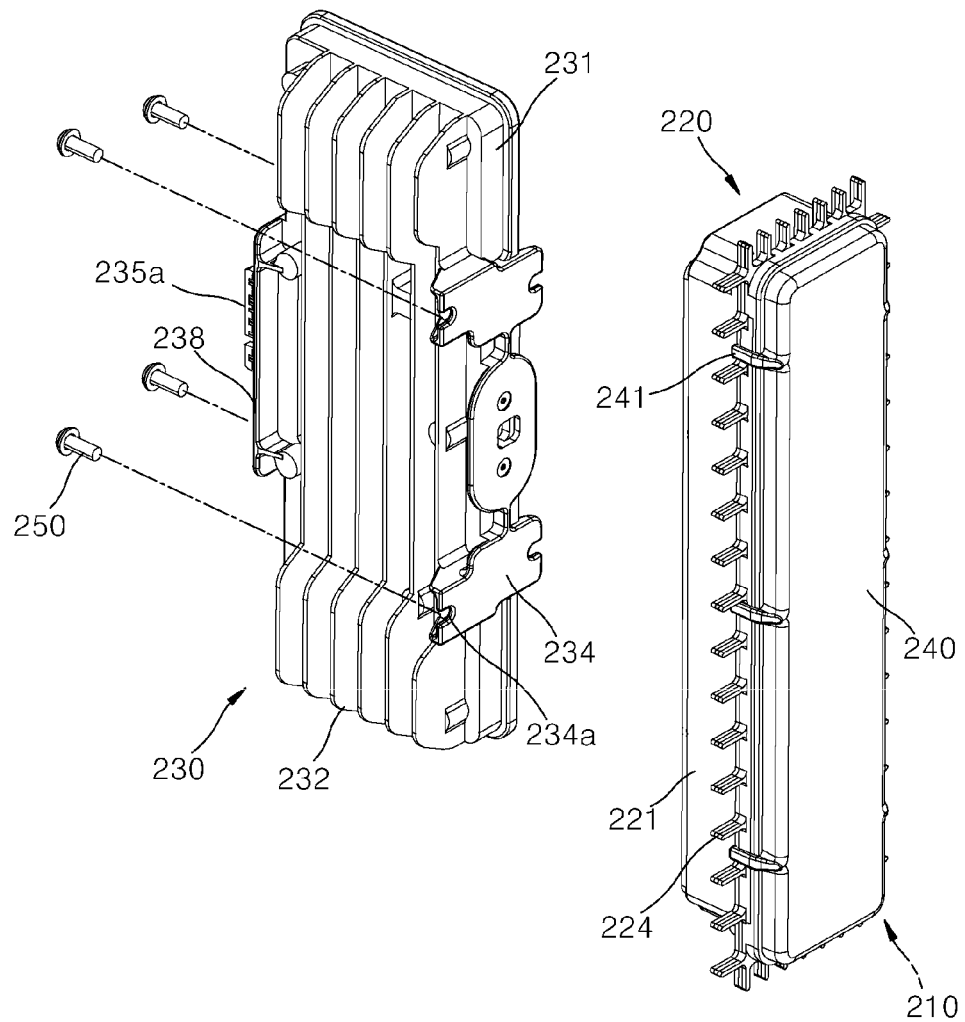
Figure 17C:
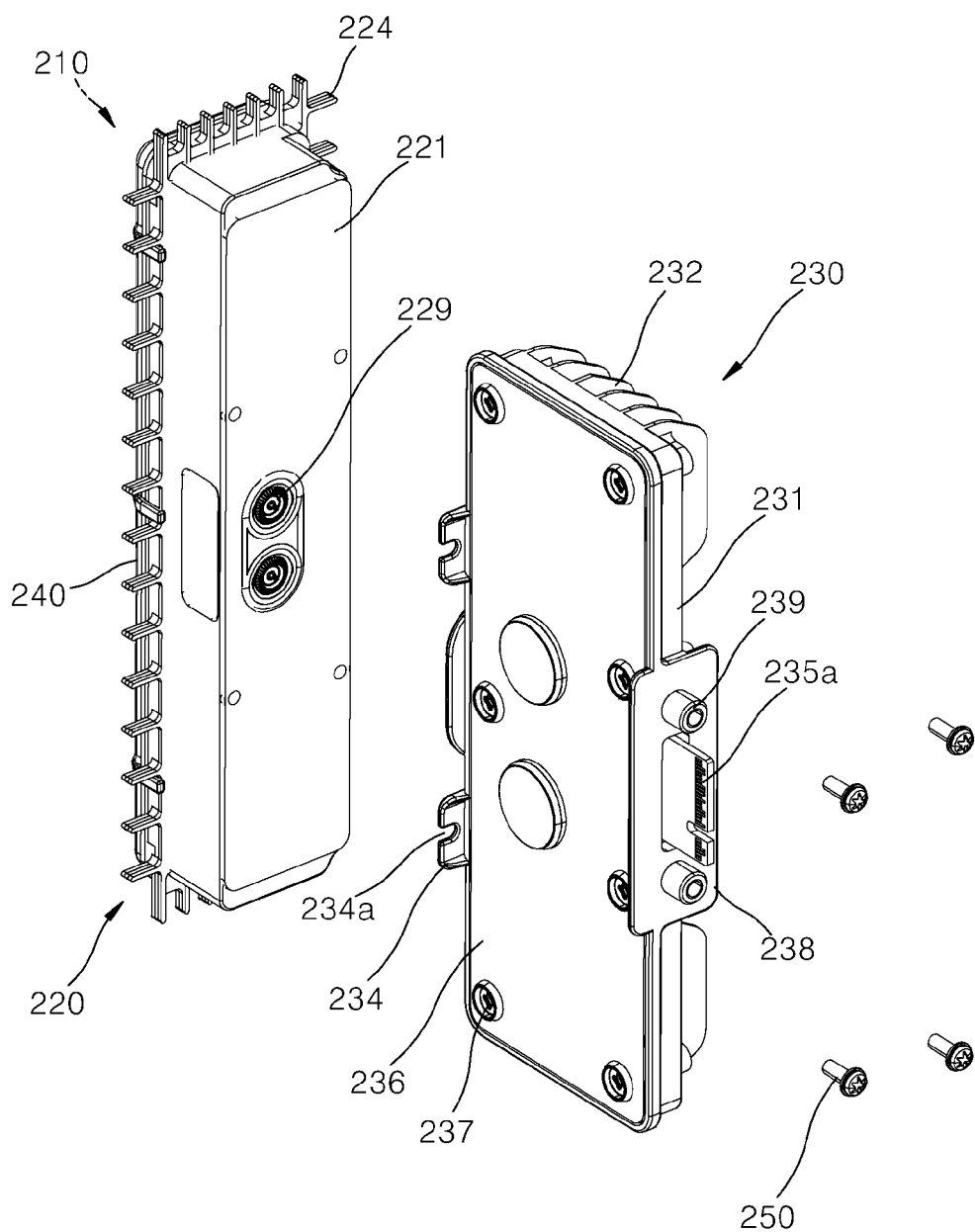
Figure 17D:
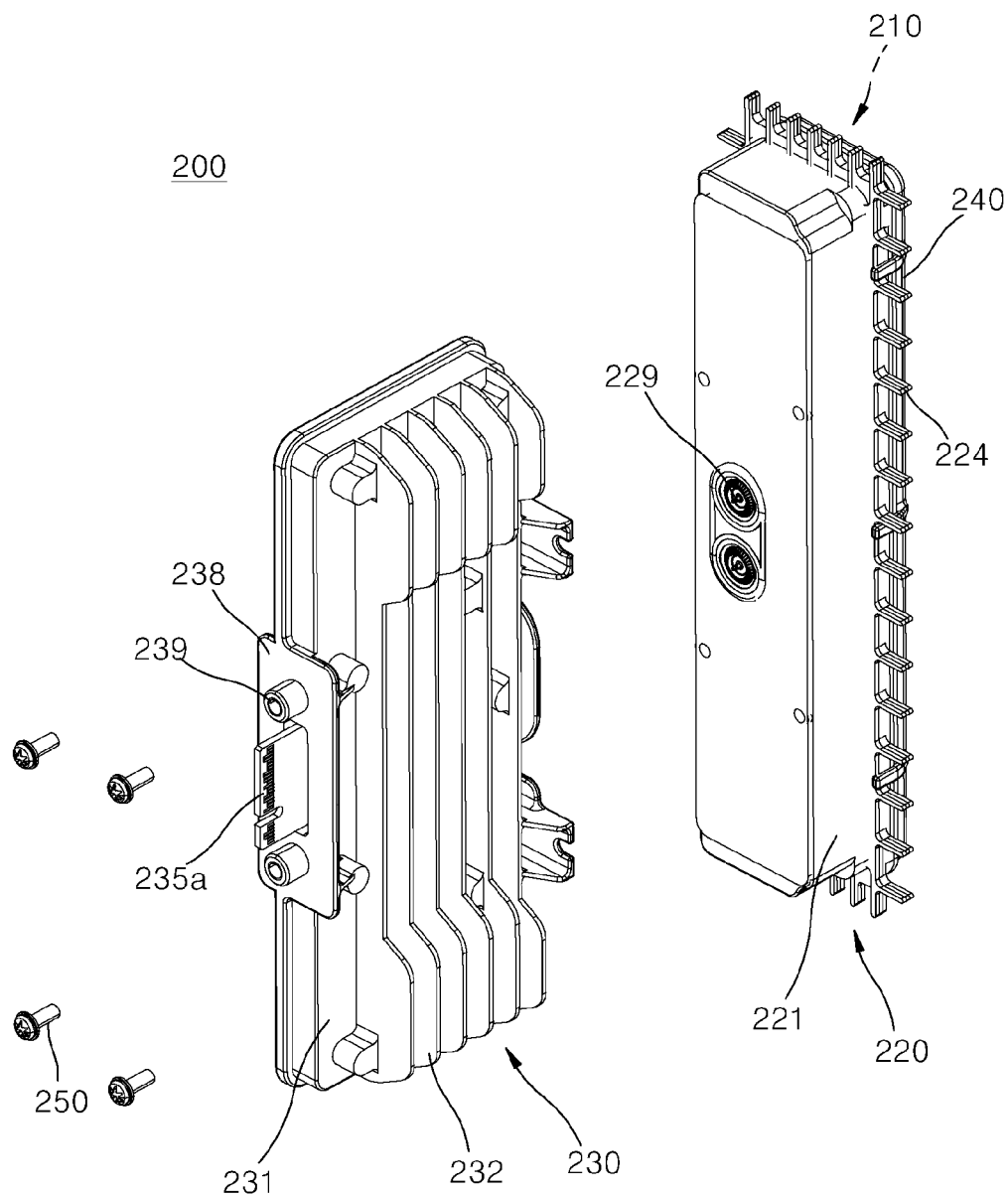
Figure 19A:
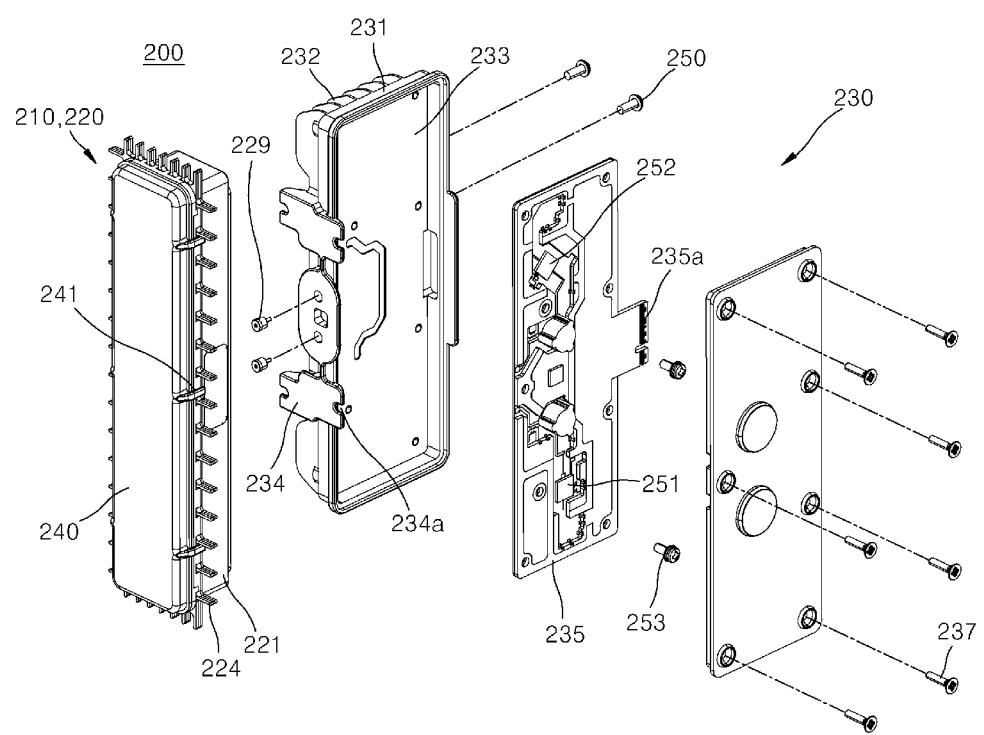
FIGS. 19a and 19b are exploded perspective views illustrating a state where the amplification element module, one of the constituent elements of the RF module, installed.
Figure 19B:
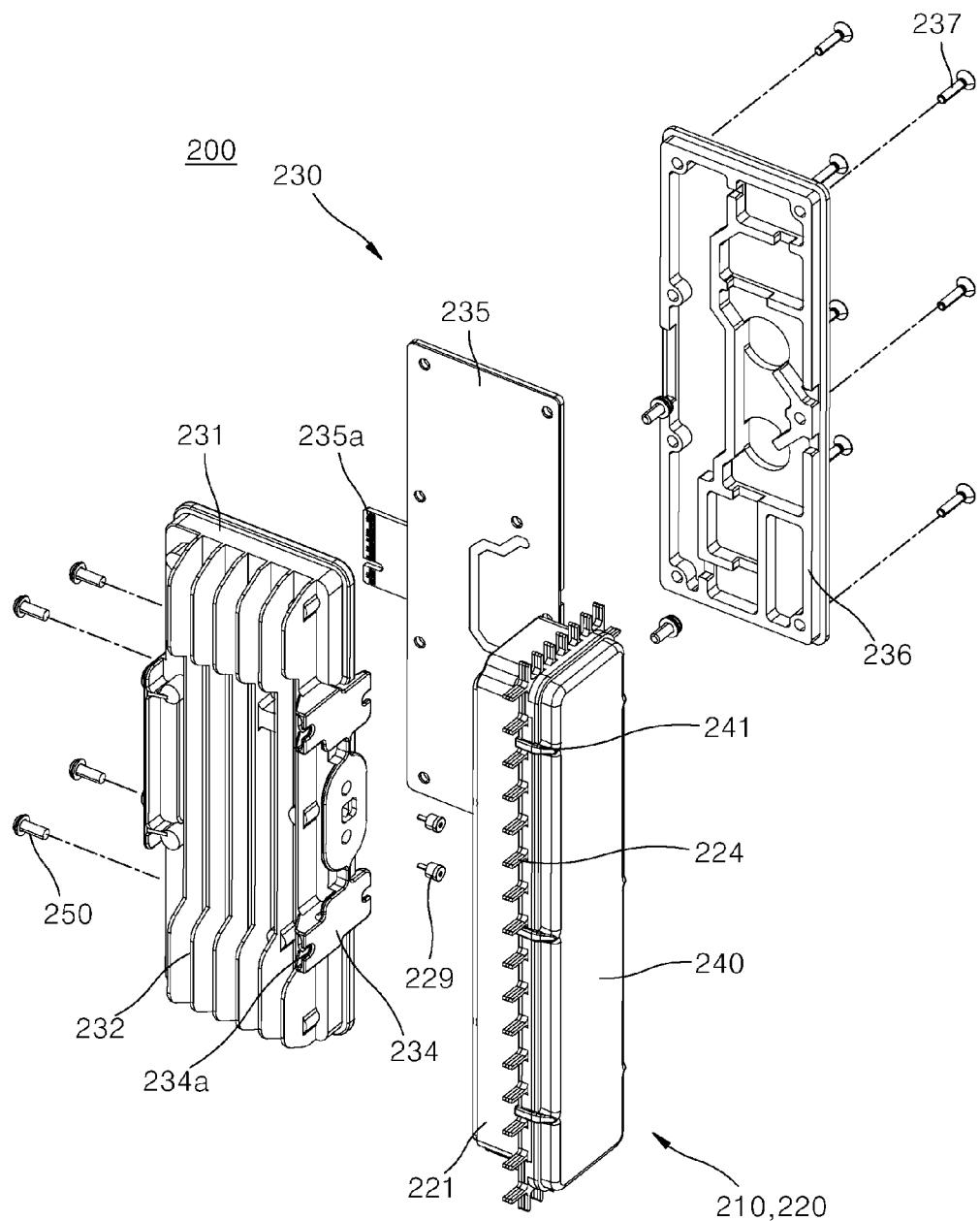

FIG. 12 is an exploded perspective view illustrating a state where the RF module 200, one of the constituent elements in FIG. 2, is installed in the front housing 140. FIG. 13 is an enlarged perspective view illustrating a portion of the front surface of the front housing 140 that the RF module 200 is attached to and detached from, and a portion of a rear surface of the RF module 200. FIG. 14 is a cut-away perspective view illustrating a state where the RF module 200 is combined with the main board 170. FIG. 15 is a perspective view illustrating the RF module 200, as a single unit, one of the constituent elements in FIG. 2. FIG. 16 is an exploded perspective view illustrating the RF module 200, as a single unit in FIG. 15. FIGS. 17a to 17d are exploded perspective views illustrating a state where a front module, one of the constituent elements of the RF module 200, is installed and a state where a rear module, one of the constituent elements of the RF module 200, is installed. FIG. 18 is an exploded perspective view illustrating a state where a radome, one of the constituent elements of the RF module 200 is installed. FIGS. 19a and 19b are exploded perspective views each illustrating a state where an amplification element module 230, one of the constituent elements of the RF module, is installed.

As a first implementation example, with reference to FIGS. 12 to 19b, the RF module 200 according to the first embodiment of the present disclosure includes the RF filter 220 arranged on a front surface of the main board 170, the radiation element module 210 arranged on a front surface of the RF filter 220, and at least one reflector grill pin 224 which is arranged between the RF filter 220 and the radiation element module 210 and grounds (GND) the radiation element module 210 and through which outside air is introduced from in front of the RF filter 220 to in back of the RF filter 220 or is discharged from in back of the RF filter 220 to in front of the RF filter 220.

The RF module 200 is an assembly of analog RF components. For example, an amplification element module 230 is an RF component that includes the amplification unit board 235 on which an analog amplification element amplifying an RF signal is mounted, the RF filter 220 is an RF component for frequency-filtering the input RF signal to obtain an RF signal in a desired frequency band, and the radiation element module 210 is an RF component that serves to receive and transmit the RF signal.

As a second implementation example, the RF module 200 according to the first embodiment of the present disclosure may be defined as follows.

That is, the RF module 200 according to the first embodiment of the present disclosure serves as an RF module 200 that includes analog RF components. The analog RF components include the RF filter 220, the radiation element module 210 that is arranged in front of the RF filter 220, and an analog amplification element (not illustrated) on the amplification element module 230 that is arranged in rear of the RF filter 220.

The amplification element module 230 here may be electrically connected to the main board 170 inside the rear housing 110 with the amplification unit board 235 described below in between. Furthermore, as described above, for this electrical connection, the RFIC sub-board 150 may be interposed between the amplification unit board 235 and the main board 170.

The antenna RF module assembly 300 according to the second embodiment of the present disclosure that will be described below may be configured with a plurality of RF modules 200 that are implemented as the various implementation examples described above. Therefore, manufacturers that manufacture RF components are capable of manufacturing, distributing, and selling RF components for each RF module 200 or each antenna RF module assembly 300, in a state where a multiplicity of RF modules 200 are temporarily pre-assembled to the front housing 140 or are available on a per-module basis for pre-assembling, and thus have the advantage of being capable of establishing a new market environment.

Furthermore, at least one reflector grill pin 224 may be integrally formed on the RF filter 220. That is, the RF filter 220 may be manufactured of a molding material having a metal component, using a die-casting molding technique. In this case, the reflector grill pin 224 is also made of a metal material in terms of its function. In this respect, the RF filter 220 and the reflector grill pin 224 are integrally manufactured of the same molding material having a metal component, using the same die-casting molding technique as when the RF filter 220 is manufactured. However, the RF filter 220 and the reflector grill pin 224 are not necessarily limited to the metal material. It is also possible that the RF filter 220 and the reflector grill pin 224 are formed of a dielectric material, but that a film of a conductive material is formed on outer surfaces of the RF filter 220 and the reflector grill pin 224.

As a third implementation example, the RF module 200 according to the first embodiment of the present disclosure may further include the amplification element module 230 which is arranged between the main board 170 and the RF filter 220 and on which at least one analog amplification element (to which a reference numeral is not assigned) is mounted.

In this manner, as illustrated in FIGS. 12 to 14, the RF module 200 in which the radiation element module 210 is combined with the front of the RF filter 220 and in which the amplification element module 230 is combined with the back of the RF filter 220 may be combined, on a per-module basis, with the main board 170 in a socket-pin coupling manner with the front housing 140 in between.

To that end, as illustrated in FIGS. 12 to 14, the socket through-hole 143 may be formed in the front housing 140 in a manner that passes therethrough in the forward-backward direction, a surface seating portion 147 may be formed in the vicinity of the socket through-hole 143. A ring installation groove 149 in which a foreign-material introduction prevention ring 144 described below is interposed by being inserted thereinto may be formed in the surface seating portion 147. Furthermore, module assembling screws 146 for installing the RF module 200 may be provided inside the socket through-hole 143 in a manner that they are spaced apart in the upward-downward direction. The module assembling screw 146 may be assembled into a rear surface of the front housing 140 by passing therethrough toward the front direction and then may be fastened to a rear surface of the RF module 200.

As illustrated in FIG. 13(b), a joint flange 238 may be formed on the rear surface of the RF module 200. The male socket 235a on the amplification unit board 235 described below passes through the joint flange 238, then is exposed toward the rear direction and is joined to the surface seating portion 147 on the front housing 140. A screw boss 239 to which the module assembling screw 146 is fixed by being fastened thereto may be formed on the joint flange 238.

At this point, the RF module 200 is provided in such a manner as to be exposed to the outside air in front that is defined as the space in front of the front surface of the front housing 140. Therefore, there is a need to prevent foreign materials, including rainwater and dust, from being introduced into the front housing 140. In the RF module 200 according to the first embodiment, as illustrated in FIG. 14, the joint flange 238 on the RF module 200 is brought into close contact with the surface seating portion 147 on the front housing 140, and then the module assembling screw 146 is tightened to keep the joint flange 238 and the surface seating portion 147 in close contact with each other. Thus, the foreign-material introduction prevention ring 144 interposed in the ring installation groove 149 can completely close the gap between the joint flange 238 on the RF module 200 and the surface seating portion on the front housing 140.

The amplification element module 230 serves to receive a signal from the main board 170 and a signal from the RF filter 220, to amplify these signals by a predetermined value, and to output the resulting signals.

The amplification element module 230 may include an amplification unit body 231 having a board seating space 233 that is open at one side or the other side in a width direction, the amplification unit board 235, and an amplification unit cover 236 that is provided in such a manner as to cover the amplification unit board 235. The amplification unit board 235 is seated inside the amplification unit body 231. A front end portion of an edge of the amplification unit board 235 is connected to the RF filter 220 for signal transmission, and a rear end portion of the edge thereof is connected to the main board 170 (connected to the RFIC sub-board 150 in a case where, as an implementation example, the RFIC sub-board 150 is provided separately from the main board 170) for signal transmission.

The amplification element module 230 with this configuration, as illustrated in FIGS. 17a to 17d, is simply electrically connected to the RF filter 220 described below in a feed through-pin coupling manner. Moreover, the amplification element module 230 is physically combined with the RF filter 220 by a module assembling screw 250 that is fastened into a screw assembling groove 234a in an assembling panel 234 formed on the amplification unit body 231.

The amplification unit board 235 may be combined with the RF filter 220 with a through-pin terminal 229 in between, in a feed through-pin coupling manner, and may be combined with the main board 170 (more desirably, the RFIC board sub-board 150) in a socket-pin coupling manner.

In addition, at least one male socket 235a for combination with the main board 170 (or the RFIC sub-board 150 in a case where, as an implementation example, the RFIC sub-board 150 is provided separately from the main board 170) in a socket pin coupling manner may be provided on the amplification unit board 235.

The amplification unit board 235 may be adhesively combined with an inner surface of the amplification unit body 231. A multiplicity of amplification-unit heat sink pins 232 may be integrally formed on an outer surface of the amplification unit body 231. The multiplicity of amplification-unit heat sink pins 232 dissipate heat generated from the analog amplification elements on the amplification unit board 235 toward the external space. At least one of a PA element and an LNA element may be mounted, as an analog amplification element, on the amplification unit board 235.

In the relates art, the analog amplification elements (the PA element and the LNA element) that are primary heat generating elements are mounted on the main board 170 provided in the installation space 115 between the rear housing 110 and the front housing 140. In the RF module 200 according to the first embodiment of the present disclosure, the analog amplification elements are manufactured on a per-module basis in the same manner as the amplification element module 230. Moreover, a design change is made in such a manner that the analog amplification elements are exposed to the outside air in front that is defined as the space in front of the front surface of the front housing 140 that is a space where heat is easily dissipated. Thus, the advantage of distributing thermal overload in the installation space 115 and concurrently improving the performance in heat dissipation can be achieved.

At this point, the amplification unit board 235, as illustrated in FIGS. 19a and 19b, is installed in the board seating space 233 in such a manner that one surface of the amplification unit board 235 is brought into close contact with an inner surface of the board seating space 233. Two PAs 251 and 252, which are power amplifiers among the analog amplification elements, are mounted on the other surface of the amplification unit board 235, thereby possibly constituting a 2T2R antenna.

Heat that is generated from the two PAs 251 and 252 may be easily dissipated to the outside through the multiplicity of amplification-unit heat sink pins 232 that are integrally formed with the amplification unit body 231 in such a manner as to be adjacent to an inner surface of the board seating space 233.

Figure 20:
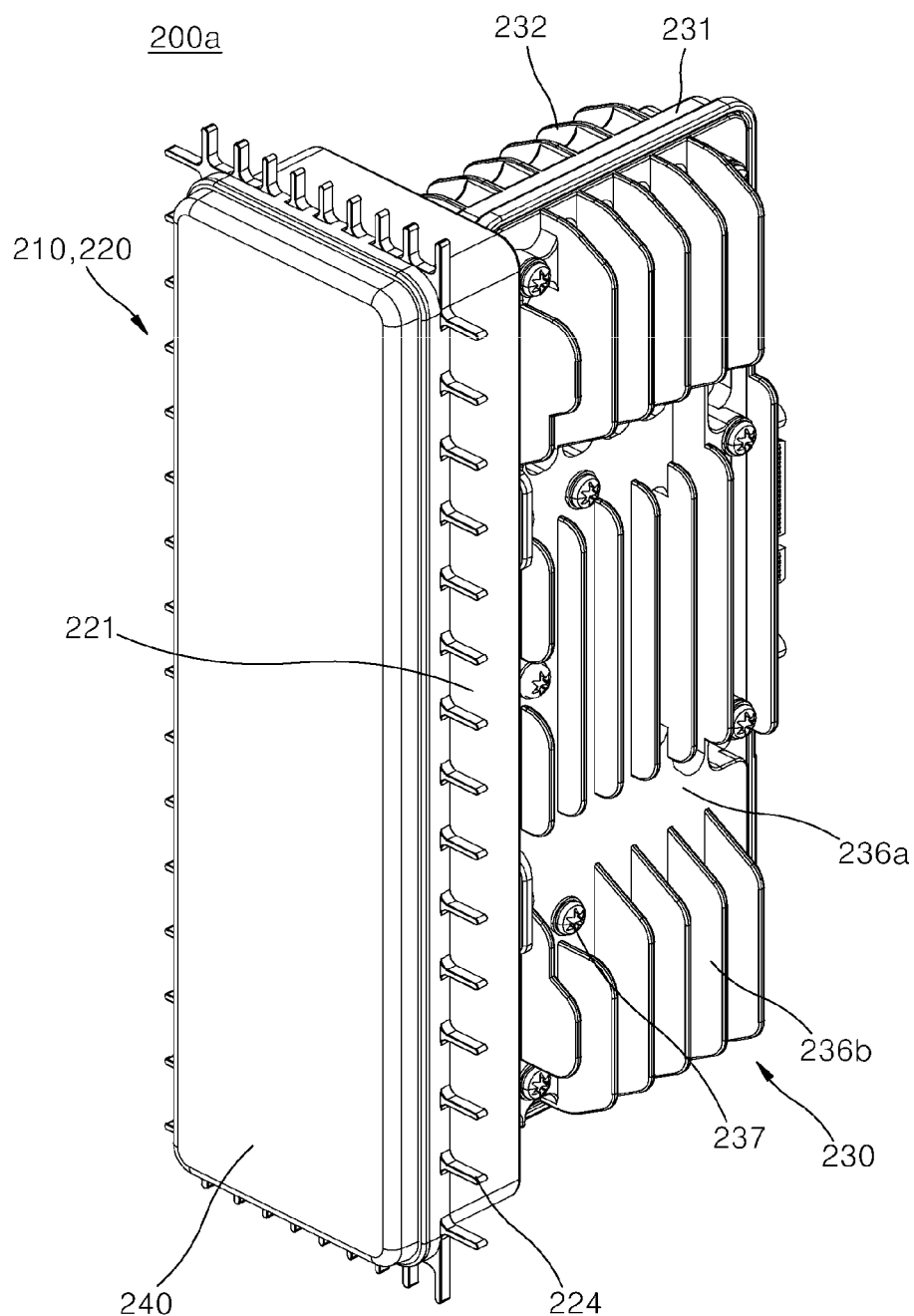
FIG. 20 is a perspective view illustrating another implementation example of the amplification element module, one of the constituent elements of the RF module.
Figure 21:
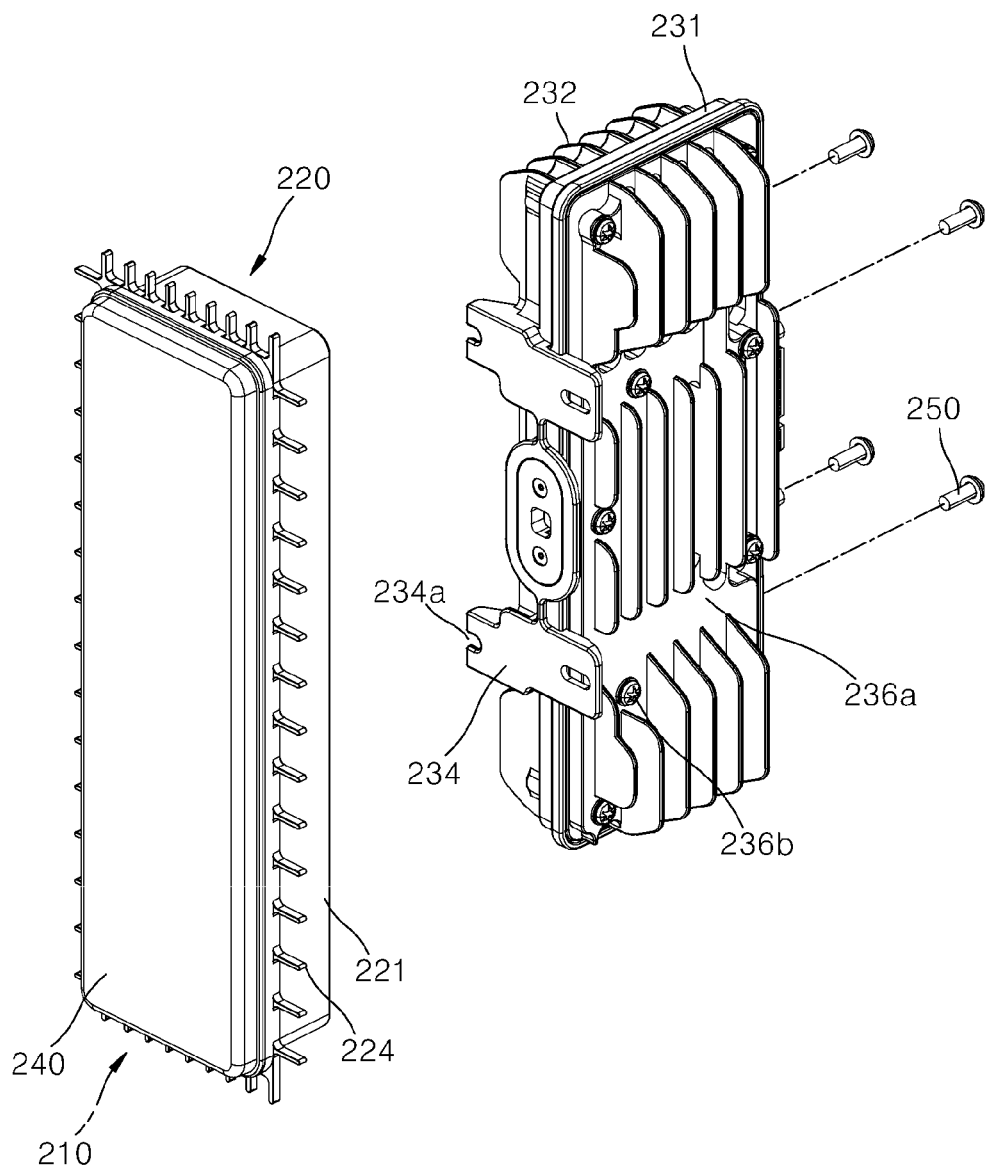
FIG. 21 is an exploded perspective view illustrating a state where the radiation element module, the RF filter, and the amplification element module that are among constituent elements in FIG. 20 are installed.
Figure 22A:
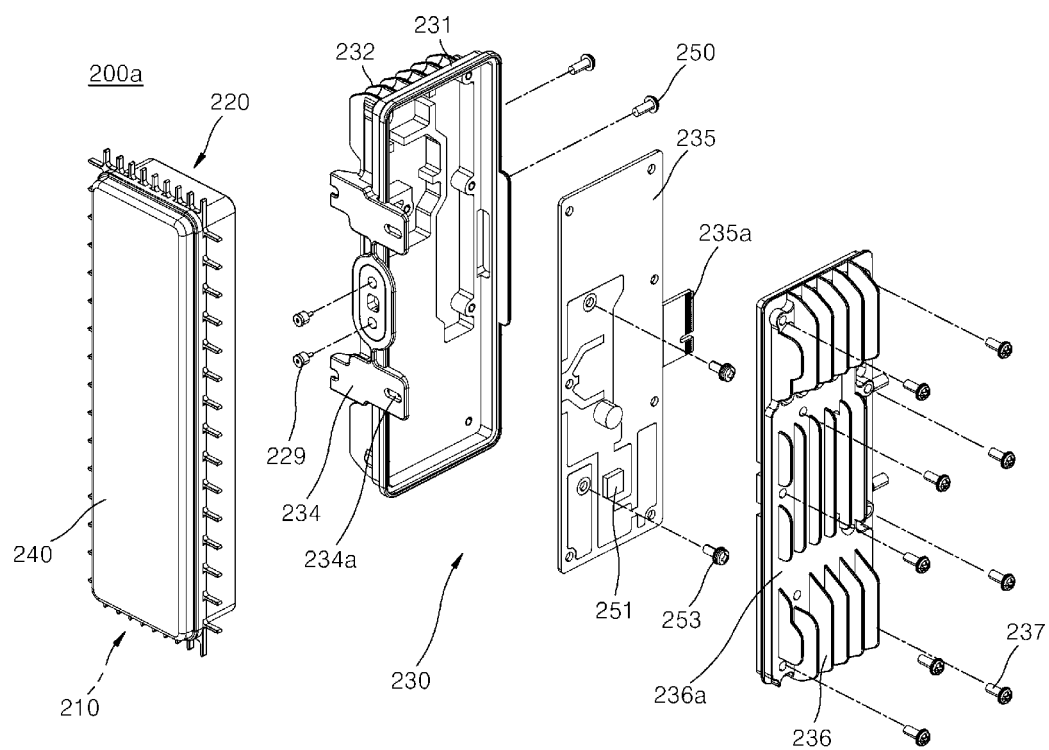
FIGS. 22a and 22b are exploded perspective views illustrating a state where the amplification element module, one of the constituent elements in FIG. 20 is installed.
Figure 22B:
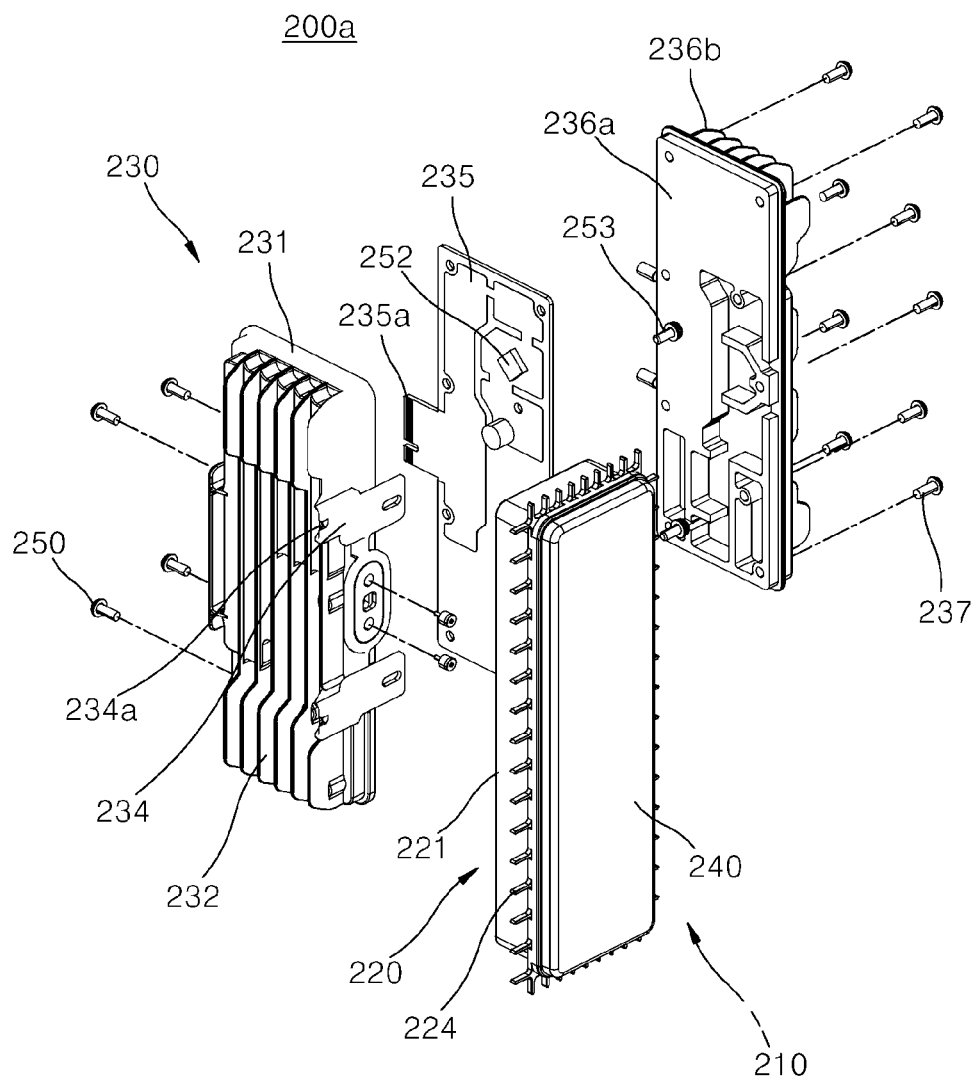

FIG. 20 is a perspective view illustrating another implementation example of the amplification element module 230, one of the constituent elements of the RF module 200. FIG. 21 is an exploded perspective view illustrating a state where the radiation element module 210, the RF filter 220, and the amplification element module 230 that are among constituent elements in FIG. 20 are installed. FIGS. 22a and 22b are exploded perspective views illustrating a state where the amplification element module 230, one of the constituent elements in FIG. 20 is installed.

One implementation example of the amplification element module 230 that is described with reference to FIGS. 15 to 19b is designed to have a heat dissipation structure. In this heat dissipation structure, the amplification unit board 235 is seated on the board seating space 233 in one side (or the other side), open in the width direction, of the amplification unit body 231. Furthermore, the analog amplification elements (the PA element and the LNA elements are mounted only on the opposite surface (the other surface) of both surfaces of the amplification unit board 235, the opposite surface facing one side, which is open, of the amplification unit body 231. Heat generated from the analog amplification elements is dissipated through the multiplicity of amplification-unit heat sink pins 232 that are integrally formed with the amplification unit body 231 in such a manner as to perform a heat dissipation function.

However, the two PAs 251 and 252 are not necessarily installed in a concentrated manner on the other surface of the amplification unit board 235. As illustrated in FIGS. 20 to 22b, the two PAs 251 and 252 may be arranged to be mounted on both surfaces, respectively, of the amplification unit board 235. That is, as illustrated in FIG. 22a, one PA 251 of the two PAs 251 and 252 that realize the 2T2R antenna in one RF module 200a may be arranged to be mounted on the other surface (that is, a surface facing an amplification unit cover 236a described below) of the amplification unit board 235 in such a manner as to realize a 1T1R antenna. In addition, as illustrated in FIG. 22b, the other one 252 of the two PAs 251 and 252 that realize the 2T2R antenna in one RF module 200a may be arranged to be mounted on one surface (that is, a surface facing the inner surface of the board seating space 233) of the amplification unit board 235 in such a manner as to realize the 1T1R antenna. As a result, each surface of the amplification unit board 235 results in realizing the 1T1R antenna, and the 2T2R antenna is realized in one RF module 200a.

Furthermore, as illustrated in FIGS. 22a and 22b, a multiplicity of amplification-unit-cover heat sink pins 236b that correspond to the multiplicity of amplification-unit heat sink pins 232, respectively, that are integrally formed on the outer surface of the amplification unit body 231 described above may be integrally formed on an outer surface of an amplification unit cover 236a provided in such a manner as to cover the board seating space 233 in the amplification unit body 231.

In another implementation of the example amplification element module 230 that is configured as described above, the two PAs 251 and 252 that realize the 2T2R antenna inside one RF module 200a are distributively arranged on surfaces, both respectively, of the amplification unit board 235 in such a manner as to realize the 1T1R antenna. Heat generated from one surface of the amplification unit board 235 and heat generated from the other surface thereof are distributively dissipated through both the amplification unit body 231 and the amplification unit cover 236a, respectively. Thus, the advantage of further maximizing the performance in heat dissipation is provided.

The RF filter 220, as illustrated in FIG. 6, includes a filter body 221 in which a multiplicity of cavities 222 are formed in such a manner as to be open at front sides thereof, a resonance bar 223 arranged inside each of the multiplicity of cavities 222, and a filter outer panel 228 arranged in such a manner as to close a front surface of the filter body 221. A filter tuning cover 227 may be combined with the filter outer panel 228 and the filter body 221 in a state of being positioned therebetween.

At this point, the radiation element module 210 may be combined with the filter body 221 by being seated therein in such a manner as to cover a front surface of the filter outer panel 228.

The RF module 200 may further include a radome cover 240 that is combined with a front end portion of the RF filter 220 and protects the radiation element module 210 from the outside.

A multiplicity of hook combination portions 241 may be formed on a portion of an edge of the radome cover 240. The radome cover 240 may be hook-combined with the filter body 221 by the multiplicity of hook combination portions 241 being combined with a stepped portion of the filter body 221.

The radome cover 240 may be formed of the same material as a radome panel, as a single unit, in the related art, and may be combined with each RF module 200, as a single unit. That is, the radome cover 240 may be formed of a resin material that easily transmits a radio wave. Because an amount of heat generated when the radiation element module 210 is driven is negligible, the radome cover 240 may be formed of a thermal insulating material regardless of heat dissipation.

The radome cover 240 is combined with the filter body 221 while blocking the radiation element module 210 from being viewed from the outside. Thus, the radome cover 240 may serve to protect the radiation element module 210 from the external environment (for example, a foreign material or the like). The RF module 200 is installed in such a manner as to be exposed to the outside air in front that is defined as the space in front of the front surface of the front housing 140. For this reason, although not illustrated in the drawings, particularly, it is desired that the radome cover 240 has a sealing structure that completely blocks a foreign material, such as rainwater, from being introduced into the filter body 221 in which the radiation element module 210 is provided.

Furthermore, the RF filter 220 and the radiation element module 210, as illustrated in FIG. 18, may be electrically connected to each other with a through-pin terminal 226 in between, in a feed through-pin coupling manner.

The RF module 200 according to the first embodiment of the present disclosure that has various forms, as the various implementation examples described above, will be descried in more detail below with reference to the accompanying drawings.

The RF module 200, as illustrated in FIGS. 10 to 14, may be arranged in a stacked manner on the front surface of the main board 170 with the front housing 140 in between.

In the antenna apparatus 100 according to the third embodiment of the present disclosure, a plurality of RF modules 200 are provided and thus constitute the antenna RF module assembly 300.

In this case, a configuration is employed in which a total of 32 RF modules 200, as illustrated in FIGS. 10 and 12, are arranged adjacent to each other in four rows in the leftward-rightward direction and in eight columns in the upward-downward direction. However, the RF modules 200 are not necessarily limited to this arrangement. Of course, it is to be naturally expected that the positions of the RF modules 200 in the arrangement and the number of the RF modules 200 may be variously changed during the design phase.

In addition, the RF filter 220 according to the first embodiment of the present disclosure is described, taking as an example a cavity filter in which a predetermined cavity 222 is formed in one side thereof and which is configured to include a dielectric resonator (DR) or a metal resonance bar 223 in the predetermined cavity 222. However, the RF filter 220 is not limited to this cavity filter, and various filters, such as a dielectric filter, may be used as the RF filter 220.

Furthermore, a multiplicity of radiation element modules 210 are correspondingly combined with a multiplicity of RF filters 220, respectively. Each of the multiplicity of radiation element modules 210 operates as a 2T2R dual antenna. Therefore, the antenna apparatus 100 according to the third embodiment of the present disclosure adopts, for example, a model that operates as a 64T64R antenna, but is not limited to this model. For example, in a case where an area where radiation elements are arranged can increase by two times, it is also possible that each of the radiation element modules 210 is provided in such a manner as to operate as a 1T1R antenna. In a case where it is assumed that the performance in heat dissipation can be further improved, it is also possible that each of the radiation element modules 210 is provided in such a manner as to operate as a 4T4R antenna.

Usually, in order to implement beamforming, the multiplicity of radiation element modules 210 are necessary as an array antenna. The multiplicity of radiation element modules 210 may generate a narrow directional beam and may increase concentration of radio wave toward a designated direction. In recent years, dipole antennas or patch antennas have been utilized most frequently as the multiplicity of radiation element modules 210. The multiplicity of radiation element modules 210 are designed in such a manner that they are arranged to be spaced apart to minimize signal interference with each other.

Figure 23A:
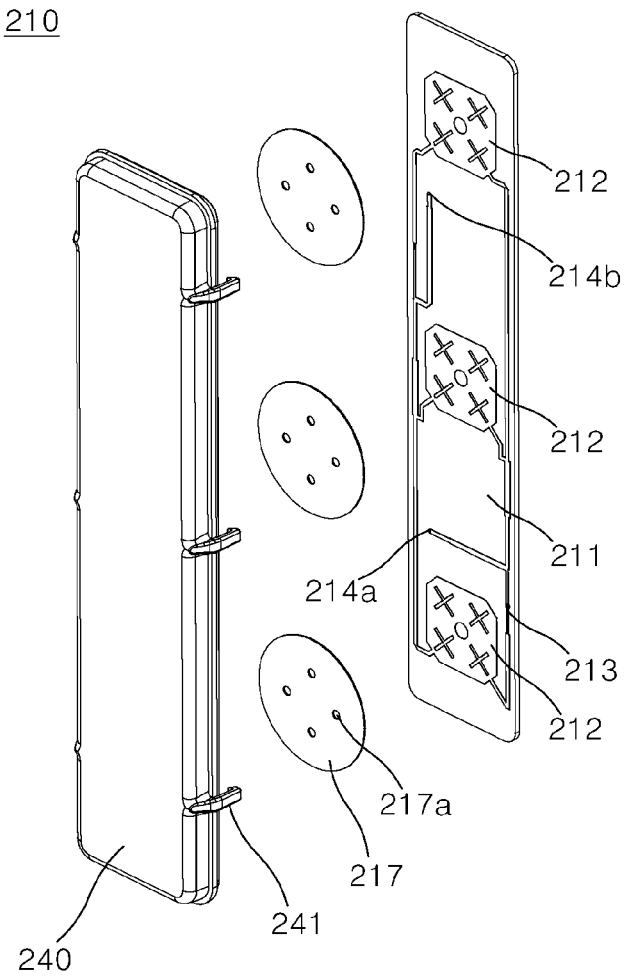
FIGS. 23a and 23b are exploded perspective views each illustrating the radiation element module.
Figure 23B:
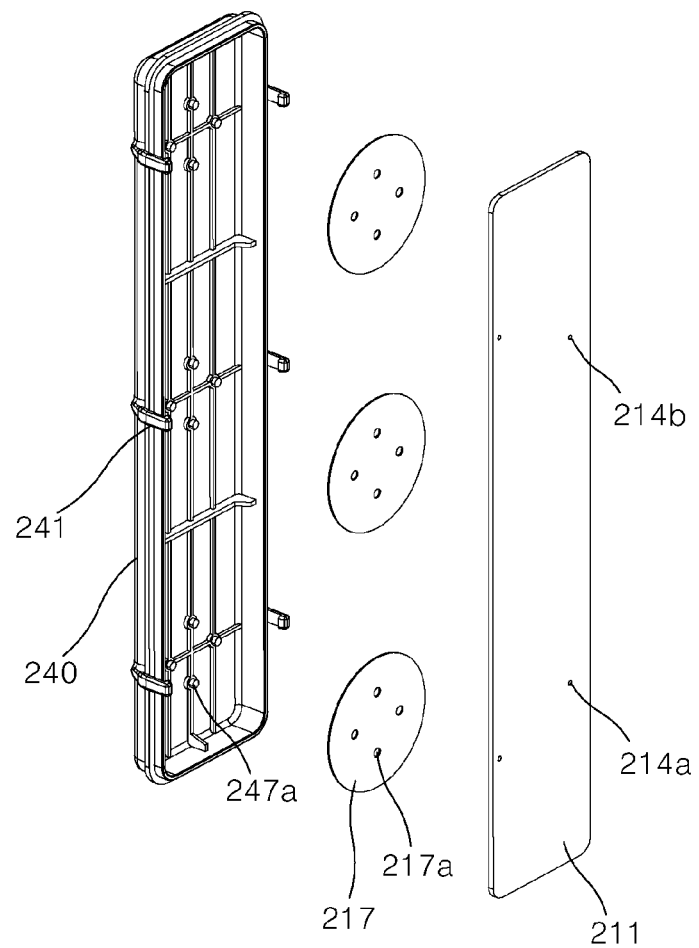
Figure 24:
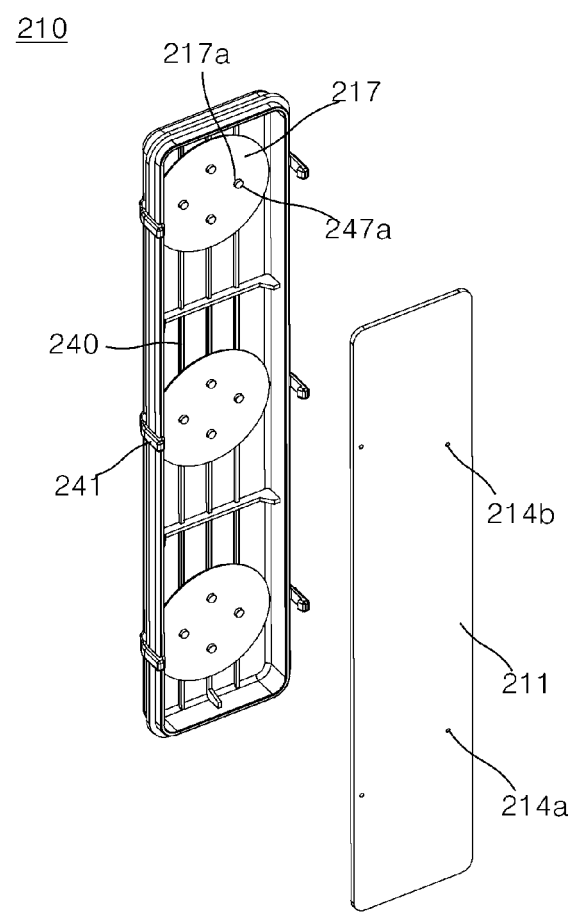
FIG. 24 is an exploded perspective view illustrating a state where a radome of a radiation director, one of constituent elements of the radiation element module, is installed.

FIGS. 23a and 23b are exploded perspective views each illustrating the radiation element module. FIG. 24 is an exploded perspective view illustrating a state where a radome of a radiation director, one of constituent elements of the radiation element module, is installed.

In the RF module 200, as a fourth implementation example, according to the first embodiment of the present disclosure, the radiation element module 210, as illustrated in FIGS. 23a and 23b, may include a radiation-element printed circuit board 211 that is formed in a manner that extends over a long distance in the upward-downward direction, and is arranged on each of the front surfaces of the multiplicity of RF filters, one or more antenna patch circuit units 212 that are formed on a front surface of the radiation-element printed circuit board 211 by being pattern-printed thereon, and an electricity supply line 213 that connects the one or more antenna patch circuit units 212 to each other for electricity supply.

As illustrated in FIG. 23a, the above-described antenna patch circuit unit 212, as a dual polarization patch element that generates any one dual polarization of +45 polarization and vertical/horizontal polarization that are orthogonal to each other may be print-formed on the front surface of the radiation-element printed circuit board 211. Three antenna patch circuit units 212 may be print-formed to be spaced apart from each other in the upward-downward direction (the lengthwise direction). The three antenna patch circuit units 212 may be connected by the electricity supply line 213 to each other.

As illustrated in FIG. 23b, an input feeding line and an output feeding line that branch off from the electricity supply line 213 may be formed on the radiation-element printed circuit board 211. Electricity supply signal are applied and output through the input feeding line and the output feeding line, respectively. An input through-hole 214a and an output through-hole 214b may be formed on front end portions, respectively, of the input feeding line and the output feeding line in such a manner that they pass therethrough, respectively. Through-pin terminals 226 arranged on the back of the radiation-element printed circuit board 211 are inserted into the input through-hole 214a and the output through-hole 214b, respectively. The through-pin terminals 226 that constitute the RF filters 220 are inserted into the input through-hole 214a and the output through-hole 214b, respectively, and thus may be electrically connected to the electricity supply line 213.

A radiation director 217 is formed of a metal material having a heat transfer property or conductivity and is electrically connected to the antenna patch circuit unit 212. The radiation director 217 may perform a function of guiding a radiation beam toward the front direction. In the RF module 200 according to the first embodiment of the present disclosure, a total of 3 radiation directors 217 are arranged on the RF modules 200, respectively, in such a manner as to secure a maximum gain.

Furthermore, as illustrated in FIGS. 23a and 23b, a multiplicity of combination holes 217a in which a multiplicity of combination protrusions 247a, respectively, formed on a rear surface of the radome cover 240 are inserted for combination may be formed in the radiation director 217.

Therefore, since the multiplicity of combination protrusions 247a are inserted into the multiplicity of combination holes 217a for combination, the radiation director 217, along with the radiation-element printed circuit board 211, may be module-combined with the rear surface of the radome cover 240. Then, the radome cover 240 may be simply assembled to the RF filter 220 by being combined therewith through the use of the hook combination portion 241.

Typically, in an antenna apparatus, a reflector serves to ground an antenna circuit and functions as a reflection surface. For example, a radiation beam that is emitted in the rear direction by a dual polarization antenna is reflected toward a primary radiation direction, and thus beam efficiency of the dual polarization antenna is improved. According to the first embodiment of the present disclosure, the reflector grill pin 224 and the outer panel 228 that are described below may perform a function of the reflector.

Figure 25:
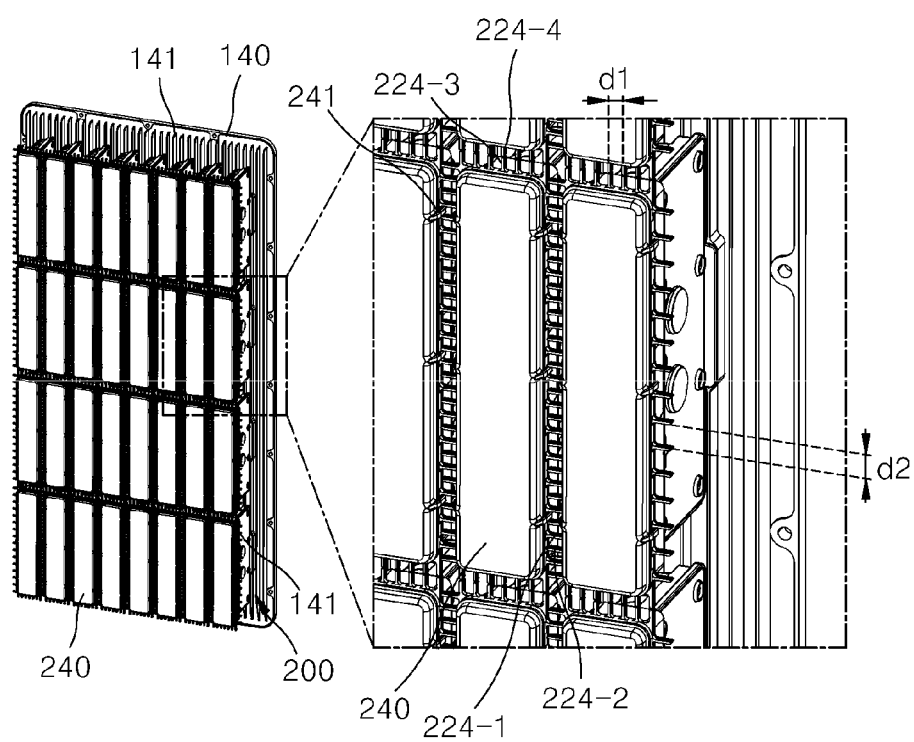
FIG. 25 is a perspective view and a partially enlarged perspective view that illustrate a shape of a reflector grill pin, one of the constituent elements of the RF module in FIG. 2, and an arranged state of the reflector grill pins, respectively.
Figure 26:
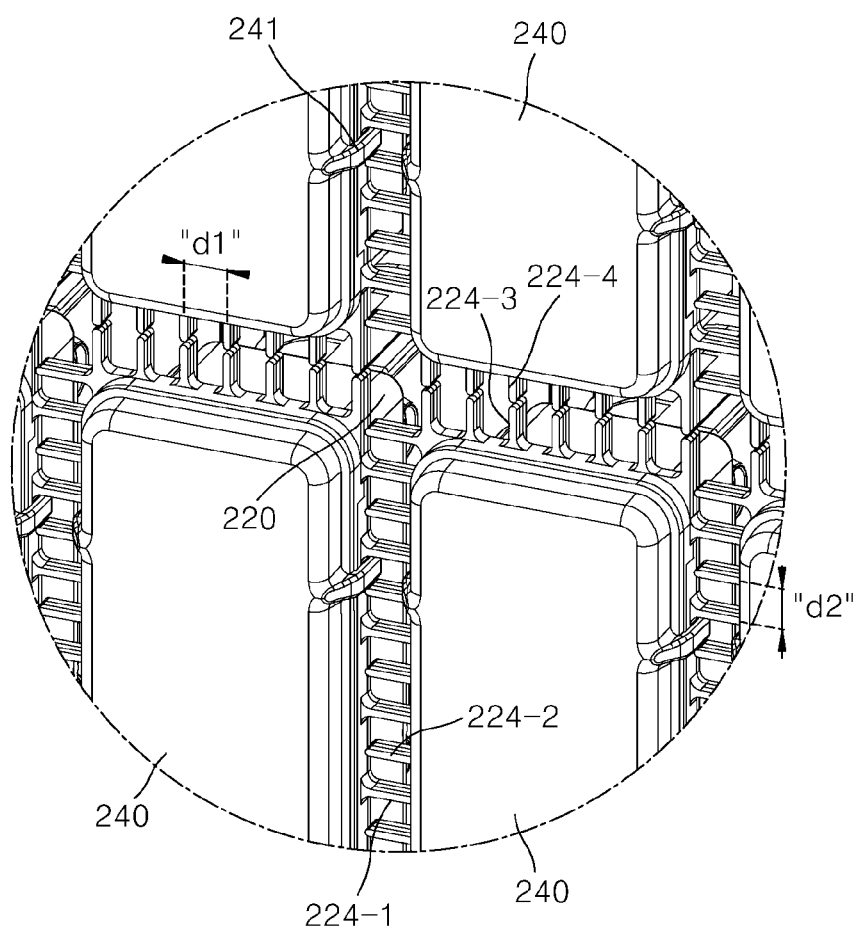
FIG. 26 is a partially enlarged perspective view illustrating an arrangement relationship among reflector grill pins.

FIG. 25 is a perspective view and a partially enlarged perspective view that illustrate a shape of the reflector grill pin 224, one of the constituent elements of the RF module 200 in FIG. 2, and an arranged state of the reflector grill pins 224. FIG. 26 is a partially enlarged perspective view illustrating an arrangement relationship among the reflector grill pins 224.

The reflector grill pin 224, as illustrated in FIGS. 25 and 26, may be combined with another reflector grill pin 224 of an adjacent RF filter 220 and may form a mesh topology in which heat dissipation holes are formed in the shape of a grill. With this configuration, heat dissipated from the front housing 140 in back of the multiplicity of RF filters 220 that are positioned at a relatively remote distance in the rear direction may be easily discharged into the outside space through a multiplicity of heat dissipation holes that are formed by a multiplicity of reflector grill pins 224. Accordingly, the multiplicity of heat dissipation holes may serve as a heat discharging hole through which heat generated between the front surface of the front housing 140 and the reflector grill pin 224 is discharged to the outside. Accordingly, outside air in front may be actively used to dissipate the heat generated in the antenna apparatus 100.

As illustrated in FIG. 25, the reflector grill pins 224-1 and 224-3 formed on the RF filter 220 on one side and the reflector grill pins 224-2 and 224-4, adjacent to the reflector grill pins 224-1 and 224-3, respectively, that are formed on the RF filter 220 on the other side, although not in contact with each other, may be formed to extend in such a manner as to overlap each other in an arbitrary vertical line, so that each of the multiplicity of reflector grill pins 224-1 to 224-4 serves to satisfactorily perform the grounding (GND) function and at the same time to maintain a predetermined ventilation function. In this manner, the reflector grill pins 224-1 and 224-2 are arranged in such a manner as to overlap each other, thereby providing the advantage of increasing a grounding sharing area toward a lateral surface of the antenna.

Distances d1 and d2 between the reflector grill pins 224 may be suitably set by simulating durability and heat dissipation characteristics of the reflector grill pin 224 during the design phase. It is desired that the distances d1 and d2 are set considering a distance by which the radiation elements included in the radiation element module 210 are arranged to be spaced. Furthermore, the distances d1 and d2 between the reflector grill pins 224, as described below, may be set considering a wavelength of an operating frequency during the design phase. For example, in order to reduce a propagation loss, the distances d1 and d2 between the reflector grill pins 224 may be set to 1/20) or smaller of the operating frequency.

In addition, the distances d1 and d2 between the reflector grill pins 224 in one RF module 200 is 1/10λ or smaller. When the multiplicity of RF modules 200 are assembled, the reflector grill pins 224 intersect, thereby forming holes having a size of 1/20λ or smaller.

For example, the distance d1 and d2 between the reflector grill pins 224 may be set to have a size range of 1/10λ to 1/20λ of the operating frequency. In this case, the size of 1/10λ has its meaning as an upper limit threshold value at which the reflector grill pins 224 satisfactorily serve as a ground connection (GND) to the radiation element module 210, and the size of 1/20λ has its meaning as a lower limit threshold value at which a minimum flow of outside air is secured through the heat dissipation holes that are formed by the multiplicity of reflector grill pins 224.

Therefore, it is desired that the reflector grill pins 224 are formed in such a manner that the distances d1 and d2 therebetween are greater than 1/20λ of the operating frequency, but is smaller than 1/10λ of the operating frequency.

Furthermore, the reflector grill pins 224, along with the above-described filter outer panel 228, are arranged in such a manner as to cover the front surfaces of the multiplicity of RF filters 220 and may serve as ground connections (GND) to the multiplicity of radiation element modules 210. To this end, it is desired that the filter outer panel 228, the filter body 221 of the RF filter 220, and the reflector grill pins 224 are all made of a metal material.

In terms of the grounding (GND) function, the reflector grill pin 224 may be defined as a constituent element that, along with the above-described filter outer panel 228, performs a function of expanding a common ground region between the multiplicity of RF filters 220 and the multiplicity of radiation element modules 210.

Furthermore, the reflector grill pins 224 may not only serve as the ground connections (GND) to the multiplicity of radiation element modules 210, but may also serve to protect from the outside the RF filters 220 exposed to the outside air in front that is defined as the space in front of the front surface of the front housing 140.

Figure 27A:
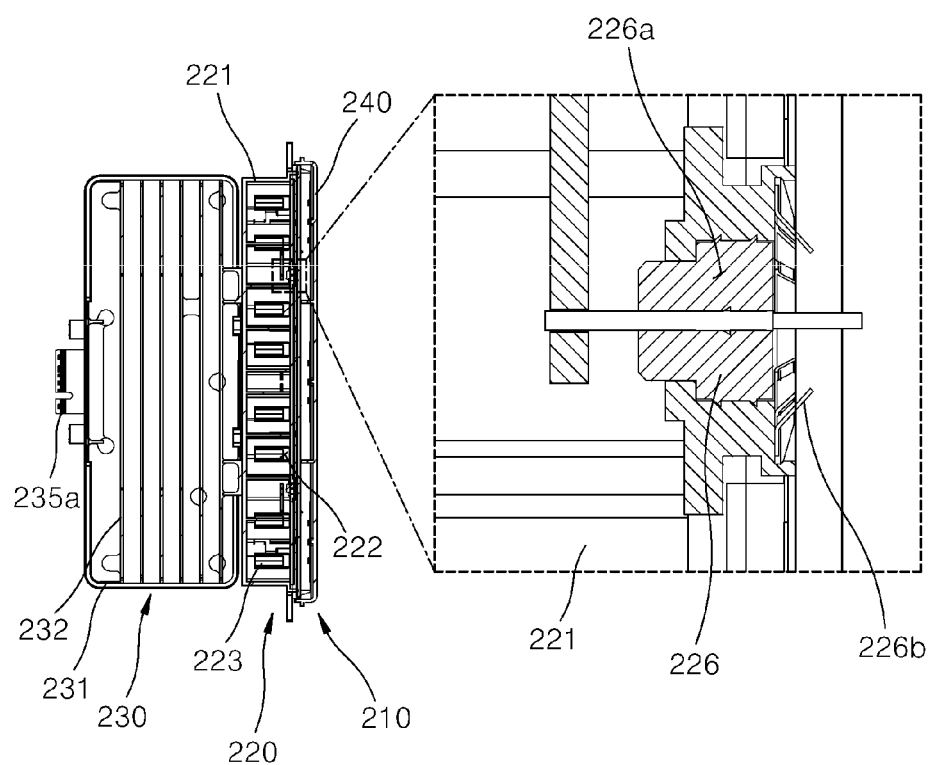
FIG. 27a is a cross-sectional view and a partially enlarged cross-sectional view that are taken along line A-A on the RF module, as a single unit, in FIG. 15.
Figure 27B:
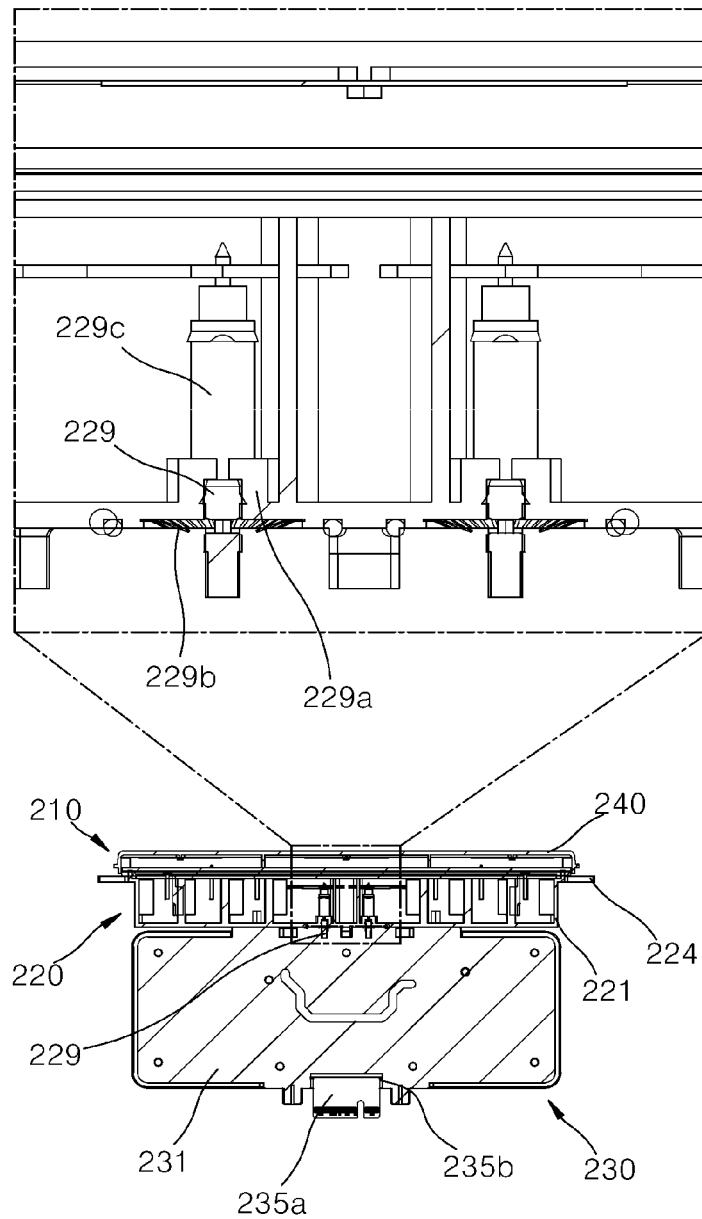
FIG. 27b is a cross-sectional view and a partially enlarged cross-sectional view that are taken along line B-B on the RF module, as a single unit, in FIG. 15.

FIG. 27a is a cross-sectional view and a partially enlarged cross-sectional view that are taken along line A-A on the RF module, as a single unit, in FIG. 15. FIG. 27b is a cross-sectional view and a partially enlarged cross-sectional view that are taken along line B-B on the RF module, as a single unit, in FIG. 15.

With reference to FIG. 27a, in a state where the radiation element module 210 is combined with the radome cover 240, when the radome cover 240 is adhesively assembled to the back of the RF filter 220, a coupling force is exerted toward a connection space 226a in which the through-pin terminal 226 is provided, and thus the radome cover 240 is elastically supported on an elastic ground washer 226b arranged toward the front of the connection space 226a. Thus, the tolerance on the assembly is achieved, and the assembling is immediately completed at a predetermined position in a feed through-pin coupling manner.

In addition, with reference to FIG. 27b, when the RF filter 220 and the amplification element module 230 are brought into close contact with each other, in a case where the through-pin terminal 229 is brought into contact with a through-pin connection terminal 229c that is provided inside the RF filter 220 and serves intermediary for electrical connection to the amplification element module 230, the through-pin terminal 229 is elastically supported on an elastic ground washer 229b arranged toward the back of the RF filter 220. Thus, the tolerance on the assembly is achieved, and the assembling is immediately completed at a predetermined position in a feed through-pin coupling manner. Therefore, the assembling of each of the constituent elements of the RF module 200 is simply completed in a feed through-pin coupling manner. Moreover, as described above, the RF module 200 itself is simply brought into contact with the front surface of the main board 170 in a socket-pin coupling manner. Thus, the ease of assembly can be greatly improved.

In this manner, the antenna apparatus 100 according to the third embodiment of the present disclosure includes the radome covers 240, as single units, that are separated on the basis of each RF module 200, instead of a radome of uniform shape in the related art, and thus effectively protects each of the radiation element modules 210 and easily discharges internal system heat generated in a mobile communication system in the antenna system 100 in all directions, including the front direction, as well as the rear direction. Therefore, the antenna apparatus 100 can achieve the greater performance in heat dissipation than an antenna apparatus in the related art.

The RF module according to the first embodiment of the present disclosure and the antenna apparatus, including the RF modules, according to the third embodiment of the present disclosure are in detail described above with reference to the accompanying drawings. The embodiments of the present disclosure are not necessarily limited to the above-described implementation examples. It is to be naturally expected that various modifications may be possibly made to the embodiments within the scope of the present disclosure or within an equivalent thereof by a person of ordinary skill in the art to which the present disclosure pertains. Therefore, the proper scope of the present disclosure should be defined by the following claims.

INDUSTRIAL APPLICABILITY

According to the present disclosure, there are provided an antenna RF module capable of being arranged in the front direction to be exposed to outside air and thus distributively dissipating heat to in front of and in back of a communication system and an antenna apparatus including the antenna RF modules. Heat dissipation performance of the antenna apparatus can be greatly improved.

The invention claimed is:

1. An antenna RF module comprising:
   an RF filter arranged on a front surface of a main board;
   a radiation element module arranged on a front surface of the RF filter; and
   an amplification element module comprising:
   an amplification unit body arranged between the main board and the RF filer and having a board seating space that is open at one side or the other side in a width direction;
   an amplification unit board seated inside the amplification unit body, a front end portion of an edge of the amplification unit board being connected to the RF filter for signal transmission, a rear end portion of the edge thereof being connected to the main board for signal transmission, and at least one analog amplification element being mounted on one surface or the other surface thereof; and
   an amplification unit cover provided in such a manner as to cover the amplification unit board,
   wherein heat generated from the at least one analog amplification element on the amplification unit board is distributively dissipated to outside air in front of one side or the other side, in a width direction, of the amplification element module through a multiplicity of amplification-unit heat sink pins integrally formed on an outer surface of the amplification unit body and through a multiplicity of amplification-unit-cover heat sink pins integrally formed on an outer surface of the amplification unit cover.

2. The antenna RF module of claim 1, wherein one of PAs, as the analog amplification elements, that realize a 2T2R antenna is arranged to be mounted on one surface of both surfaces of the amplification unit board, and the other one of the PAs, as the analog amplification elements, that realize the 2T2R antenna is arranged to be mounted on the other surface of the both surfaces of the amplification unit board.

3. The antenna RF module of claim 1, further comprising:
at least one reflector grill pin arranged between the RF filter and the radiation element module and grounding (GND) the radiation element module, outside air being introduced from in front of the RF filter to in back of the RF filter or being discharged from in back of the RF filter to in front of the RF filter through the at least one reflector grill pin; and
a radome cover combined with the front surface of the RF filter and protecting the radiation element module from the outside,
wherein the at least one reflector grill pin is integrally formed on the RF filter.

4. The antenna RF module of claim 3, wherein the RF filter and the reflector grill pins are integrally manufactured of a molding material having a metal component, using a die-casting molding technique.

5. The antenna RF module of claim 3, wherein one or several of the reflector grill pins are formed to extend in such a manner as to overlap one or several reflector grill pins, respectively, that are formed on another RF filter that is adjacent thereto.

6. The antenna RF module of claim 1, wherein the RF filter comprises:
a filter body in which a multiplicity of cavities are formed in such a manner as to be open at front sides thereof; and
a resonance bar arranged inside each of the multiplicity of cavities, and
wherein the reflector grill pins are formed along an edge of a front end portion of the filter body in such a manner as to extend upward, downward, leftward, and rightward from the edge, respectively, and to be spaced a predetermined distance apart.

7. The antenna RF module of claim 6, wherein the reflector grill pins perform a function of a reflector, along with a filter outer panel arranged in such a manner as to close a front surface of the filter body.

8. The antenna RF module of claim 6, wherein a distance between the reflector grill pins is set considering a length of the radiation element included in the radiation element module.

9. The antenna RF module of claim 1, wherein the RF filter comprises:
a filter body in which a multiplicity of cavities are formed in such a manner as to be open at front sides thereof;
a resonance bar arranged inside each of the multiplicity of cavities; and
a filter outer panel arranged to close a front surface of the filter body, and
wherein the radiation element module is combined with the filter body by being seated therein in such a manner as to cover a front surface of the filter outer panel.

10. The antenna RF module of claim 9, wherein a multiplicity of hook combination portions are formed on a portion of an edge of a radome cover, and wherein the radome cover is hook-combined with the filter body by the multiplicity of hook combination portions being combined with a stepped portion of the filter body.

11. The antenna RF module of claim 10, wherein the radome cover is combined with the filter body while blocking the radiation element module from being viewed from the outside.

12. The antenna RF module of claim 1, wherein the amplification element module receives a signal from the main board and a signal from the RF filter, amplifies these signals by a predetermined value, and outputs the resulting signals.

13. The antenna RF module of claim 1, wherein the amplification unit board is combined with the RF filter in a feed through-pin coupling manner, with a through-pin terminal in between, and is combined with the main board in a socket-pin coupling manner.

14. The antenna RF module of claim 13, wherein at least one male socket for the combination with the main board in a socket-pin coupling manner is provided on the amplification unit board.

15. The antenna RF module of claim 1, wherein the RF filter and the radiation element module are combined with each other in a feed through-pin coupling manner, with a through-pin in between.

16. An antenna apparatus comprising:
a main board, at least one digital element being mounted on a front surface or rear surface of the main board;
a casing-shaped rear housing formed to have an installation space in which the main board is installed, the installation space being open at the front side;
a front housing arranged to close the open installation space in the rear housing and separate the installation space in the rear housing and an outside space; and
a plurality of antenna RF modules arranged in front of the front housing and connected to the main board through an electrical signal line,
wherein each of the plurality of antenna RF modules comprises:
an RF filter arranged on a front surface of the main board;
a radiation element module arranged on a front surface of the RF filter; and
an amplification element module comprising:
an amplification unit body arranged between the main board and the RF filer and having a board seating space that is open at one side or the other side in a width direction;
an amplification unit board seated inside the amplification unit body, a front end portion of an edge of the amplification unit board being connected to the RF filter for signal transmission, a rear end portion of the edge thereof being connected to the main board for signal transmission, and at least one analog amplification element being mounted on one surface or the other surface thereof; and
an amplification unit cover provided in such a manner as to cover the amplification unit board, and
wherein heat generated from the at least one analog amplification element on the amplification unit board is distributively dissipated to outside air in front of one side or the other side, in a width direction, of the amplification element module through a multiplicity of amplification-unit heat sink pins integrally formed on an outer surface of the amplification unit body and through a multiplicity of amplification-unit-cover heat sink pins integrally formed on an outer surface of the amplification unit cover.

17. The antenna apparatus of claim 16, wherein one of two PAs, as the analog amplification elements, that realize an 2T2R antenna is arranged to be mounted on one of both surface of the amplification unit board, and the other one of the two PAs, as the analog amplification elements, that realize the 2T2R antenna is arranged to be mounted on the other one of the both surfaces of the amplification unit board.

18. The antenna apparatus of claim 16, further comprising:
- a surge sub-board adhesively arranged on a front surface of the rear housing in the installation space in the rear housing in such a manner as to be spaced apart from the back of the main board; and
- a PSU sub-board arranged on top of the main board in the installation space in the rear housing in such a manner as to have a front surface continuous with a front surface of the main board,
- wherein the surge sub-board and the PSU sub-board are electrically connected to each other with at least one bus bar in between, and the PSU board and the main board are electrically connected to each other with at least one bus bar in between.

19. The antenna apparatus of claim 16, wherein a multiplicity of heat dissipation pins are integrally formed on a front of the front housing.

20. The antenna apparatus of claim 16, wherein at least one intermediary female socket that is combined in a socket-pin coupling manner with the RF filter is formed on the front surface of the main board.

\* \* \* \* \*